(12) United States Patent
Zhang et al.

(10) Patent No.: US 9,853,110 B2
(45) Date of Patent: Dec. 26, 2017

(54) METHOD OF FORMING A GATE CONTACT STRUCTURE FOR A SEMICONDUCTOR DEVICE

(71) Applicant: GLOBALFOUNDRIES Inc., Grand Cayman (KY)

(72) Inventors: Xunyuan Zhang, Albany, NY (US); Ruilong Xie, Niskayuna, NY (US); Sean X. Lin, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/927,765

(22) Filed: Oct. 30, 2015

(65) Prior Publication Data

US 2017/0125530 A1    May 4, 2017

(51) Int. Cl.

| | | |
|---|---|---|
| *H01L 29/417* | (2006.01) | |
| *H01L 29/40* | (2006.01) | |
| *H01L 21/288* | (2006.01) | |
| *H01L 29/66* | (2006.01) | |
| *H01L 29/49* | (2006.01) | |
| *H01L 29/423* | (2006.01) | |
| *H01L 29/78* | (2006.01) | |
| *H01L 29/45* | (2006.01) | |

(52) U.S. Cl.
CPC ...... *H01L 29/41791* (2013.01); *H01L 21/288* (2013.01); *H01L 29/401* (2013.01); *H01L 29/41766* (2013.01); *H01L 29/42372* (2013.01); *H01L 29/456* (2013.01); *H01L 29/495* (2013.01); *H01L 29/66795* (2013.01); *H01L 29/7851* (2013.01)

(58) Field of Classification Search
CPC ......... H01L 21/76879; H01L 29/66545; H01L 29/41791
See application file for complete search history.

(56) References Cited

U.S. PATENT DOCUMENTS

| | | | |
|---|---|---|---|
| 4,692,349 A | * | 9/1987 | Georgiou ......... H01L 21/76879 257/E21.174 |
| 6,225,663 B1 | | 5/2001 | Yamaguchi et al. |
| 6,566,718 B2 | | 5/2003 | Wieczorek et al. |
| 8,557,666 B2 | | 10/2013 | Wei et al. |
| 8,703,556 B2 | | 4/2014 | Kelly et al. |

(Continued)

OTHER PUBLICATIONS

Office Action from related application U.S. Appl. No. 14/887,927 dated Aug. 25, 2016.

(Continued)

*Primary Examiner* — Bryan Junge
(74) *Attorney, Agent, or Firm* — Amerson Law Firm, PLLC

(57) ABSTRACT

One illustrative method disclosed includes, among other things, forming a gate contact opening in a layer of insulating material, performing at least one etching process through the gate contact opening to remove a gate cap layer and to expose the gate structure, selectively growing a metal material that is conductively coupled to an upper surface of the gate structure such that the grown metal material contacts all of the sidewalls of the gate contact opening and an air space is formed between a bottom of the grown metal material and a conductive source/drain structure, and forming one or more conductive materials in the gate contact opening above the grown metal material.

18 Claims, 23 Drawing Sheets

(56) References Cited

U.S. PATENT DOCUMENTS

| | | | |
|---|---|---|---|
| 8,765,546 B1 | 7/2014 | Hung et al. | |
| 9,024,388 B2 | 5/2015 | Choi et al. | |
| 2004/0087148 A1* | 5/2004 | Wong | H01L 21/76843 |
| | | | 438/687 |
| 2009/0001480 A1* | 1/2009 | Cheng | H01L 29/42368 |
| | | | 257/387 |
| 2009/0212433 A1* | 8/2009 | Yang | H01L 21/76847 |
| | | | 257/751 |
| 2010/0025775 A1* | 2/2010 | Giles | H01L 23/485 |
| | | | 257/386 |
| 2011/0147765 A1 | 6/2011 | Huang et al. | |
| 2012/0104512 A1* | 5/2012 | Horak | H01L 29/4983 |
| | | | 257/401 |
| 2012/0107970 A1 | 5/2012 | Takaki | |
| 2013/0049132 A1* | 2/2013 | Doris | H01L 21/7682 |
| | | | 257/383 |
| 2013/0187203 A1 | 7/2013 | Xie et al. | |
| 2013/0248950 A1* | 9/2013 | Kang | H01L 29/78 |
| | | | 257/288 |
| 2013/0334651 A1* | 12/2013 | Doris | H01L 29/66568 |
| | | | 257/506 |
| 2014/0054713 A1* | 2/2014 | Lee | H01L 27/088 |
| | | | 257/368 |
| 2014/0110798 A1* | 4/2014 | Cai | H01L 29/78 |
| | | | 257/410 |
| 2014/0308794 A1* | 10/2014 | Lee | H01L 21/76855 |
| | | | 438/381 |
| 2015/0014759 A1* | 1/2015 | Lee | H01L 23/5329 |
| | | | 257/306 |
| 2015/0091100 A1 | 4/2015 | Xie et al. | |
| 2015/0108589 A1* | 4/2015 | Cheng | H01L 29/511 |
| | | | 257/411 |
| 2015/0372102 A1* | 12/2015 | Usami | H01L 29/41775 |
| | | | 257/327 |
| 2016/0049487 A1* | 2/2016 | Xu | H01L 29/42364 |
| | | | 257/288 |
| 2016/0079354 A1* | 3/2016 | Park | H01L 29/66545 |
| | | | 257/386 |

OTHER PUBLICATIONS

Final Office Action from related application U.S. Appl. No. 14/887,927 dated Jan. 12, 2017.

* cited by examiner

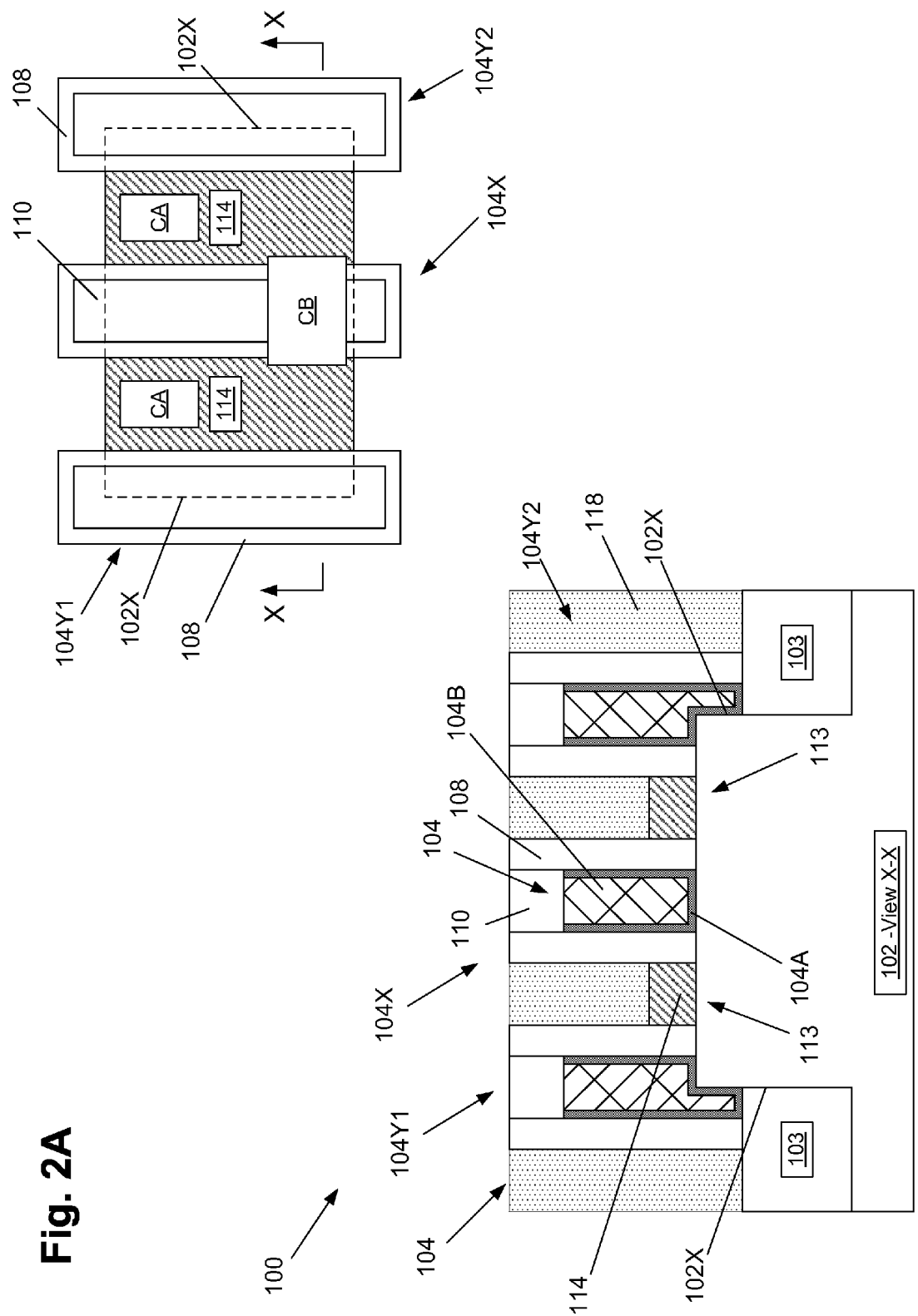

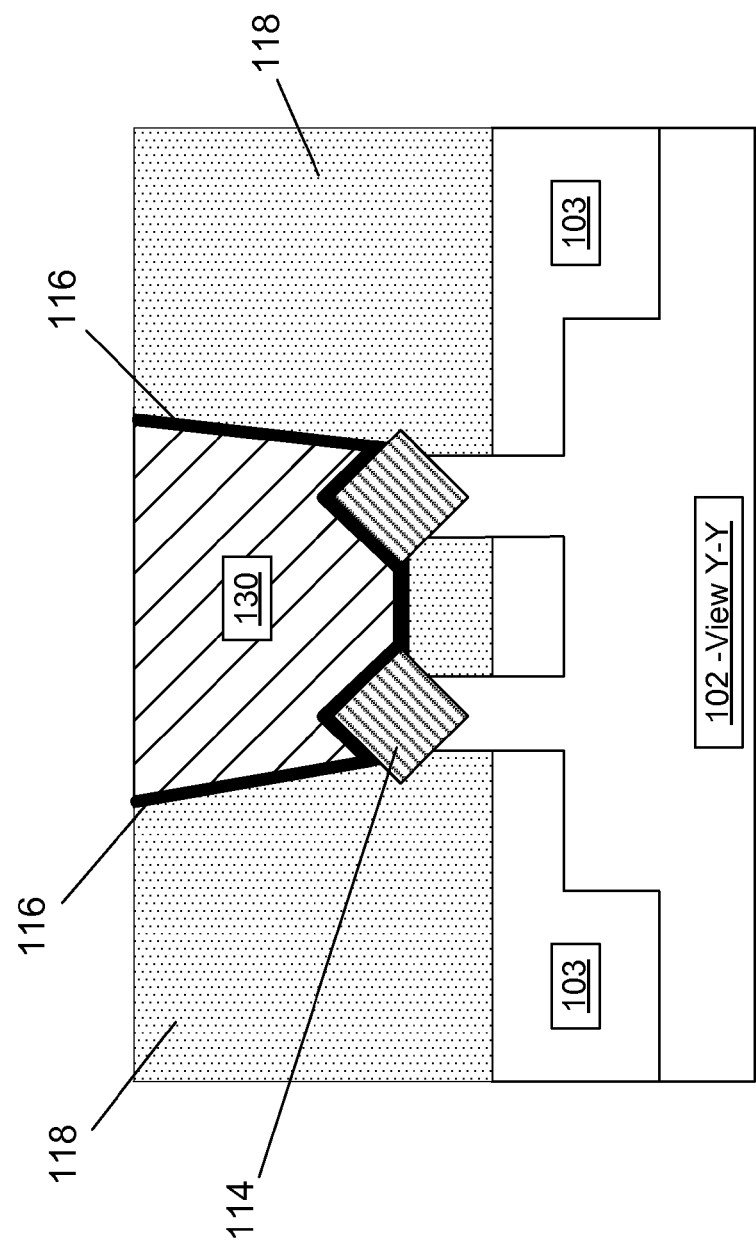

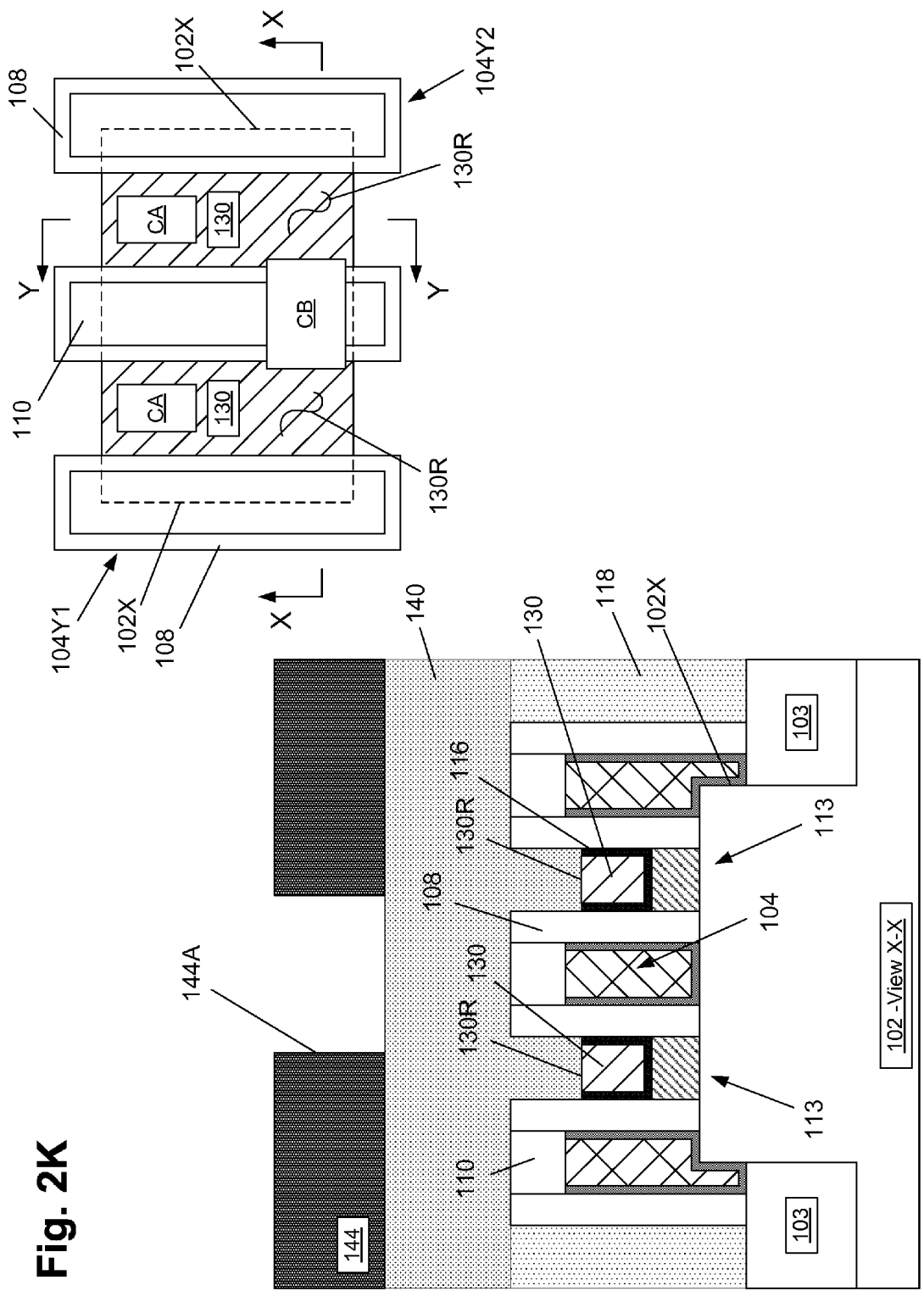

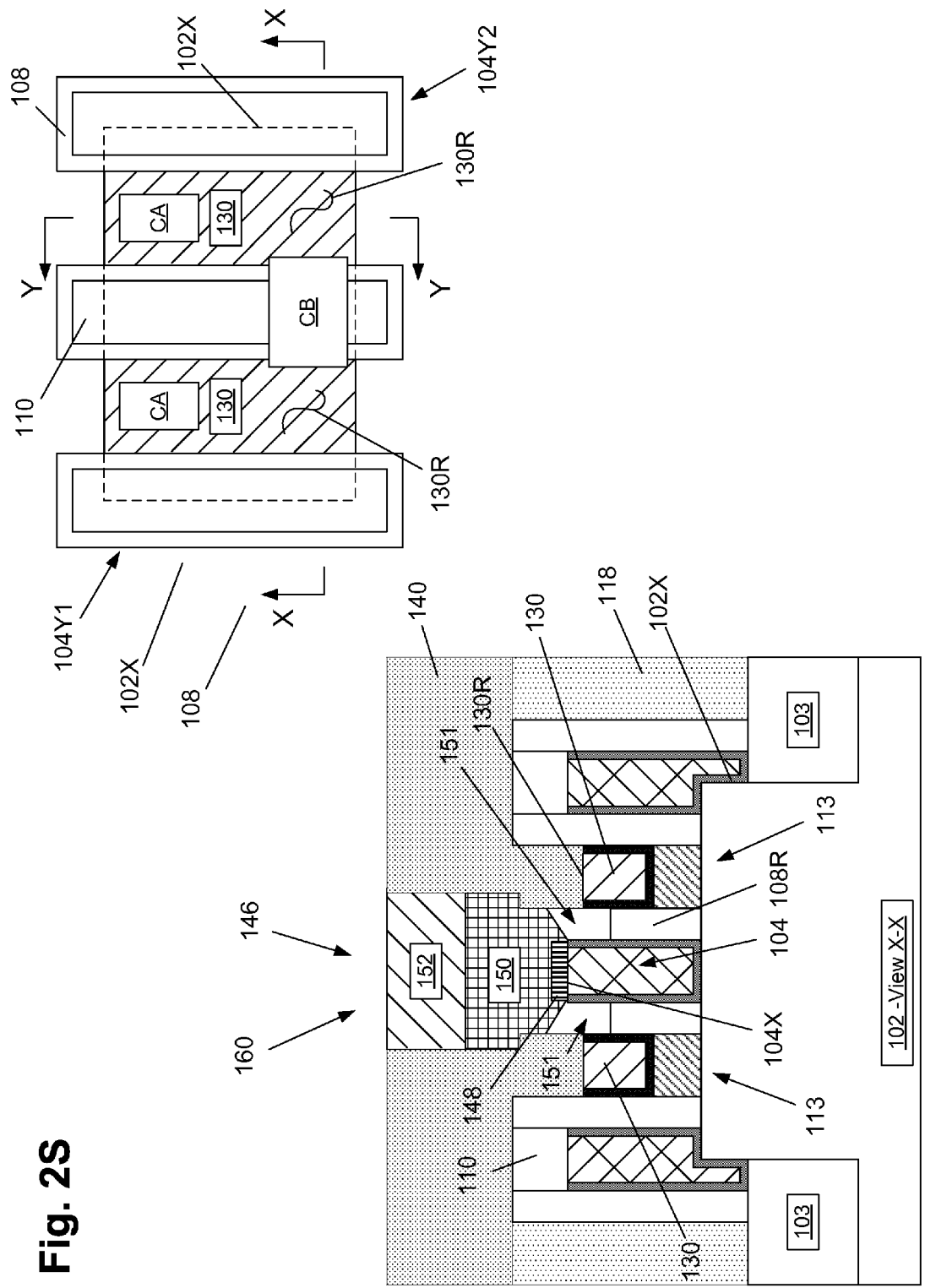

METHOD OF FORMING A GATE CONTACT STRUCTURE FOR A SEMICONDUCTOR DEVICE

BACKGROUND OF THE INVENTION

1. Field of the Invention

The present disclosure generally relates to the fabrication of integrated circuits, and, more particularly, to various methods of forming a gate contact structure for a semiconductor device and the resulting device structures.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

In contrast to a planar FET, which, as the name implies, is a generally planar structure, a so-called FinFET device has a three-dimensional (3D) structure. FIG. 1A is a perspective view of an illustrative prior art FinFET semiconductor device 10 that is formed above a semiconductor substrate 12 that will be referenced so as to explain, at a very high level, some basic features of a FinFET device. In this example, the FinFET device 10 includes three illustrative fins 14, a gate structure 16, a sidewall spacer 18 and a gate cap layer 20. Trenches 22 are formed in the substrate 12 to define the fins 14. A recessed layer of insulating material (not shown) is positioned under the gate structure 16 and between the fins 14 in the areas outside of the gate structure, i.e., in the source/drain regions of the device 10. The gate structure 16 is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device 10. The fins 14 have a three-dimensional configuration: a height H, a width W and an axial length L. The axial length L corresponds to the direction of current travel in the device 10 when it is operational. The portions of the fins 14 covered by the gate structure 16 are the channel regions of the FinFET device 10. The gate structures 16 for such FinFET devices 10 may be manufactured using so-called "gate-first" or "replacement gate" (gate-last) manufacturing techniques. A FinFET device may have either a tri-gate or dual-gate channel region. For a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior FET structure as compared to that of a planar FET, especially in the 20 nm CMOS technology node and beyond.

To improve the operating speed of FETs, and to increase the density of FETs on an integrated circuit device, device designers have greatly reduced the physical size of FETs over the years, particularly the channel length of transistor devices. As a result of the reduced dimensions of the transistor devices, the operating speed of the circuit components has been increased with every new device generation, and the "packing density," i.e., the number of transistor devices per unit area, in such products has also increased during that time.

Typically, due to the large number of circuit elements and the required complex layout of modern integrated circuits, the electrical connections or "wiring arrangement" for the individual circuit elements cannot be established within the same device level on which the circuit elements are manufactured. Accordingly, the various electrical connections that constitute the overall wiring pattern for the integrated circuit product are formed in one or more additional stacked so-called "metallization layers" that are formed above the device level of the product. These metallization layers are typically comprised of layers of insulating material with conductive metal lines or conductive vias formed in the layers of material. Generally, the conductive lines provide the intra-level electrical connections, while the conductive vias provide the inter-level connections or vertical connections between different levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures (explained more fully below) are typically referred to as "V0" vias. The conductive lines and conductive vias in these metallization layers are typically comprised of copper, and they are formed in layers of insulating material using known damascene or dual-damascene techniques.

FIG. 1B is a cross-sectional view of an illustrative integrated circuit product 10A comprised of a plurality of transistor devices 15 formed in and above a semiconductor substrate 12A. A schematically depicted isolation region 13 has also been formed in the substrate 12A. In the depicted example, the transistor devices 15 are comprised of an illustrative gate structure, i.e., a gate insulation layer 15A and a gate electrode 15B, a gate cap layer 21, a sidewall spacer 23 and simplistically depicted source/drain regions 25. At the point of fabrication depicted in FIG. 1B, layers of insulating material 17A, 17B, i.e., interlayer dielectric materials, have been formed above the product 10A. Other layers of material, such as contact etch stop layers and the like, are not depicted in the attached drawings. Also depicted are illustrative raised epi source/drain regions 25X and source/drain contact structures 27 which include a combination of a so-called "trench silicide" (TS) structure 29 and a so-called "CA contact" structure 31. Also depicted is a gate contact structure 33 which is sometimes referred to as a "CB contact" structure. The CB contact 33 is formed so as to contact a portion of the gate electrode 15B of one of the transistors 15. In a plan view, the CB gate contact 33 is positioned vertically above the isolation region 13 that surrounds the product 10A, i.e., the CB gate contact 33 is not positioned above the active region defined in the substrate 12A. The CA contact structures 31 may be in the form of discrete contact elements, i.e., one or more individual contact plugs having a generally square-like or cylindrical shape, that are formed in an interlayer dielectric material, as shown in FIG. 1B. In other applications (not shown in FIG. 1B), the CA contact structures 31 may also be a line-type feature that contacts underlying line-type features, e.g., the TS structure 29 that contacts the source/drain region 25, 25X and typically extends across the entire active region on the source/drain region 25.

Also depicted in FIG. 1B is the first metallization layer—the so-called M1 layer—of the multi-level metallization system for the product 10A that is formed in a layer of insulating material 35, e.g., a low-k insulating material. A plurality of conductive vias—so-called V0 vias 37—are provided to establish electrical connection between the device-level contacts—CA contacts 31 and the CB contact 33—and the M1 layer. The M1 layer typically includes a plurality of metal lines 39 that are routed as needed across the product 10A.

In one embodiment, the process flow of forming the TS structures 29, CA contacts 31 and CB contacts 33 may be as follows. After the first layer of insulating material 17A is deposited, TS openings are formed in the first layer of insulating material 17A that expose portions of underlying source/drain regions 25, 25X. Thereafter, traditional silicide is formed through the TS openings, followed by forming tungsten (not separately shown) on the metal silicide regions, and performing a chemical mechanical polishing (CMP) process down to the top of the gate cap layer 21. Then, the second layer of insulating material 17B is deposited and contact openings for the CA contacts 31 are formed in the second layer of insulating material 17B that expose portions of the underlying tungsten metallization above the source/drain regions 25. Next, while the opening for the CA contacts 31 is masked, the opening for the CB contact 33 is formed in the second layer of insulating material 17B and through the gate cap layer 21 so as to expose a portion of the gate electrode 15B. Typically, the CB contact 33 is in the form of a round or square plug. Thereafter, the conductive CA contacts 31 and the conductive CB contact 33 are formed in their corresponding openings in the second layer of insulating material 17B by performing one or more common metal deposition and CMP process operations, using the second layer of insulating material 17B as a polish-stop layer to remove excess material positioned outside of the contact openings. The CA contacts 31 and CB contact 33 typically contain a uniform body of metal, e.g., tungsten, and may also include one or more metallic barrier layers (not shown) positioned between the uniform body of metal and the layer of insulating material 17B. The source/drain contact structures 27 (TS contacts 29, CA contacts 31) and the CB contact 33 are all considered to be device-level contacts within the industry.

FIG. 1C is a simplistic plan view of an illustrative FinFET device comprised of three illustrative fins 41. Also depicted are illustrative CA contacts 31, a CB contact 33, a gate cap layer 21, a sidewall spacer 23 and the trench silicide structures 29 formed above the source/drain regions 25. As noted above, the CB gate contact 33 is positioned vertically above the isolation region 13 that surrounds the product 10A, i.e., the CB gate contact 33 is not positioned above the active region defined in the substrate 12A. The CB gate contact 33 is positioned above the isolation region 13 so as to avoid or reduce the chances of creating an electrical short between the CB contact 33 and the TS structure 29, i.e., there is a minimum spacing 43 that must be maintained between these two structures according to various design rules in an attempt to prevent such electrical shorts. Unfortunately, there is an area penalty associated with the requirement that the CB contact 33 only be positioned above the isolation region 13 and maintaining a minimum value for the spacing 43. The problem is the same for transistor configurations other than FinFET devices as well, e.g., planar FET devices.

What is needed is a method for forming the CB gate contact 33 above the active region of the device so as to conserve valuable plot space on an integrated circuit product.

The present disclosure is directed to various methods of forming a gate contact structure for a semiconductor device and the resulting device structures that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a gate contact structure for a semiconductor device and the resulting device structures. One illustrative method disclosed includes, among other things, forming a layer of insulating material above a gate structure, a gate cap layer, a sidewall spacer and a conductive source/drain structure, forming a gate contact opening in the layer of insulating material, performing at least one etching process through the gate contact opening to remove the gate cap layer and to expose at least a portion of an upper surface of the gate structure, performing at least one first process operation through the gate contact opening to selectively grow a metal material that is conductively coupled to the upper surface of the gate structure such that the grown metal material contacts all of the sidewalls of the gate contact opening and an air space is formed between a bottom of the grown metal material and the conductive source/drain structure, and forming one or more conductive materials in the gate contact opening above the grown metal material.

One illustrative device disclosed herein includes, among other things, a gate structure positioned above an active region defined in a semiconductor substrate, a source/drain region located adjacent the gate structure and a source/drain contact structure that is conductively coupled to the source/drain region. In this example, the device also includes a gate contact opening having sidewalls that is defined in a layer of insulating material, the gate contact opening exposing at least a portion of an upper surface of the gate structure, a metal material that is positioned within the gate contact opening and conductively coupled to the exposed upper surface of the gate structure, wherein the metal material contacts all of the sidewalls of the gate contact opening and an air space is defined and located adjacent a portion of the gate structure and below a bottom of the metal material, and one or more conductive materials positioned within the gate contact opening above the metal material.

BRIEF DESCRIPTION OF THE DRAWINGS

The disclosure may be understood by reference to the following description taken in conjunction with the accompanying drawings, in which like reference numerals identify like elements, and in which.

Figure 1A:
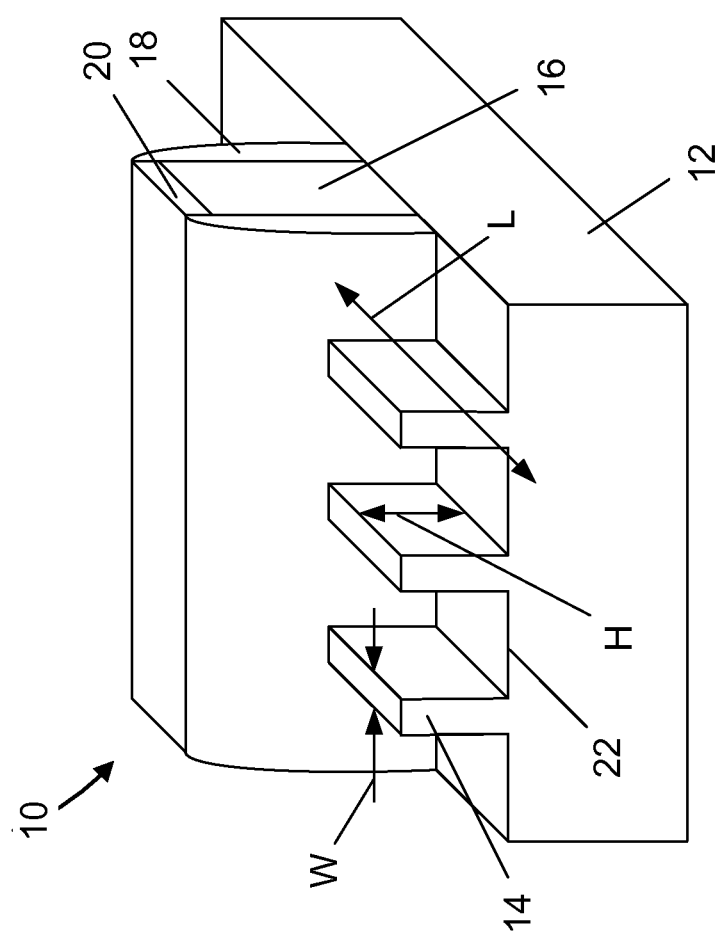
FIG. 1A is a simplistic depiction of an illustrative prior art FinFET device.
Figure 1B:
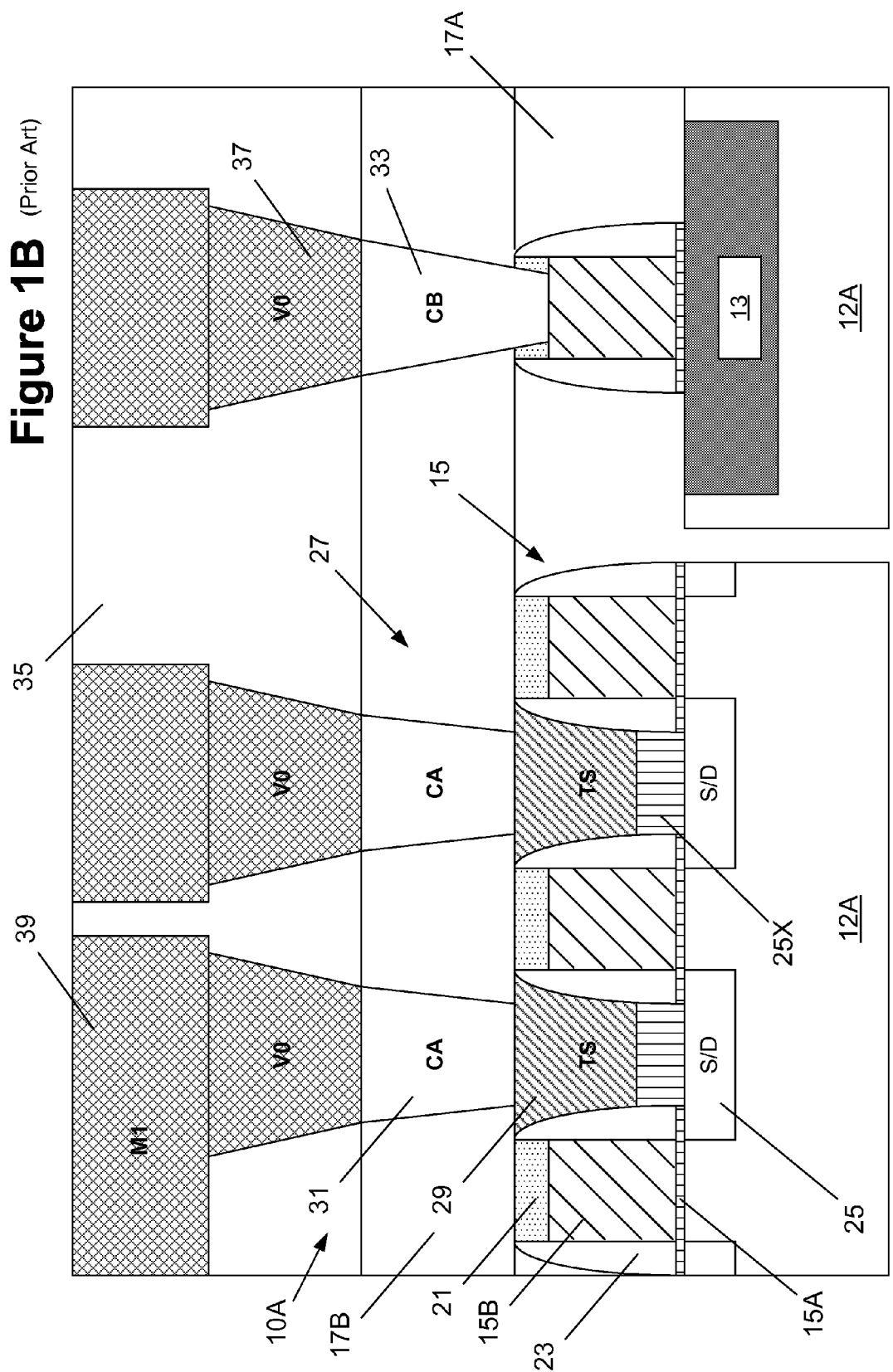
FIGS. 1B-1C depict various illustrative prior art arrangements of device-level contacts and metallization layers for an integrated circuit product.
Figure 1C:
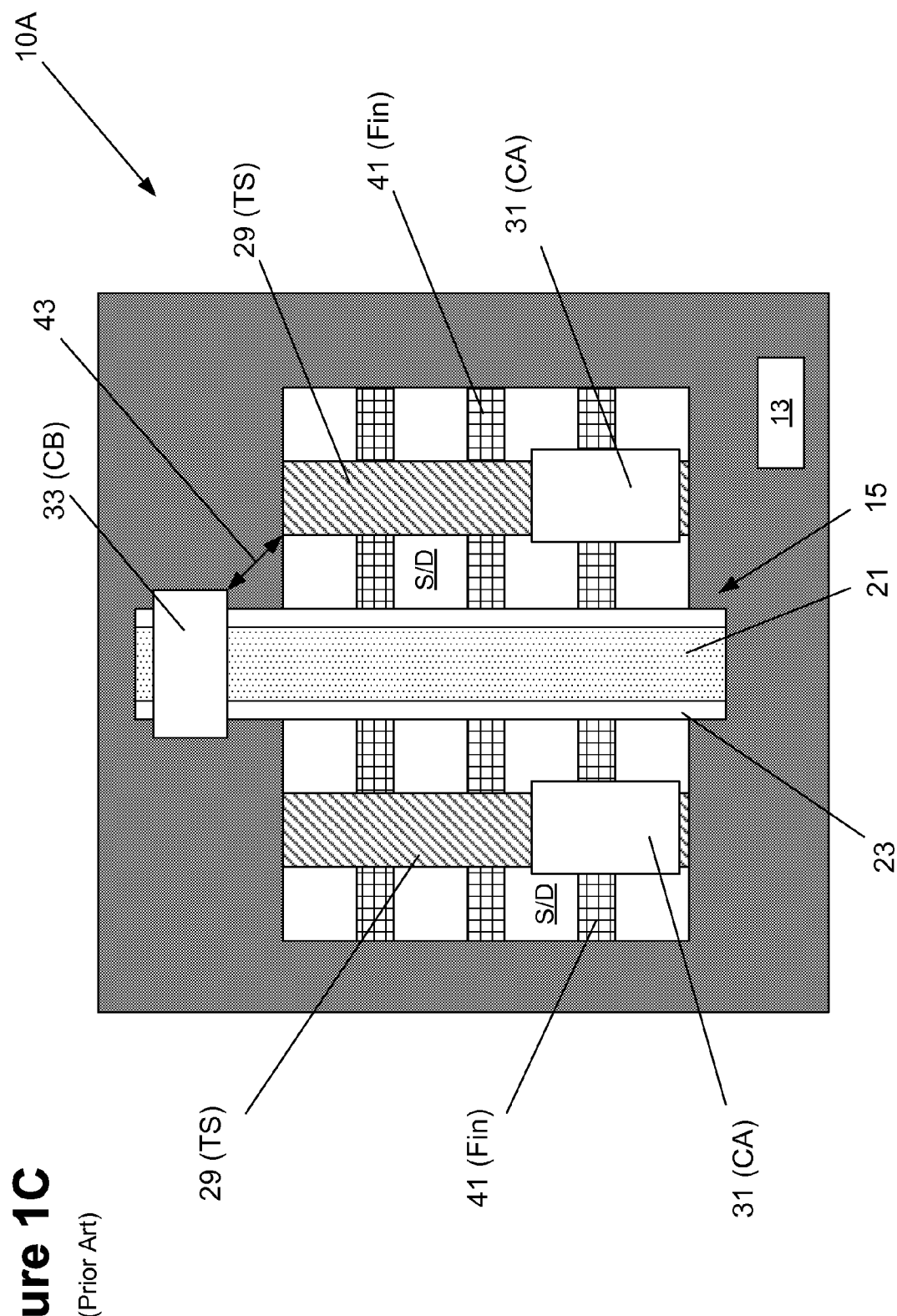

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods disclosed herein for forming a gate contact structure for a semiconductor device and the resulting device structures. The methods and devices disclosed herein may be employed in manufacturing products using a variety of technologies, e.g., NMOS, PMOS, CMOS, etc., and they may be employed in manufacturing a variety of different integrated circuit products, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. Thus, the presently disclosed inventions should not be considered to be limited to any particular form of transistors. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2B:
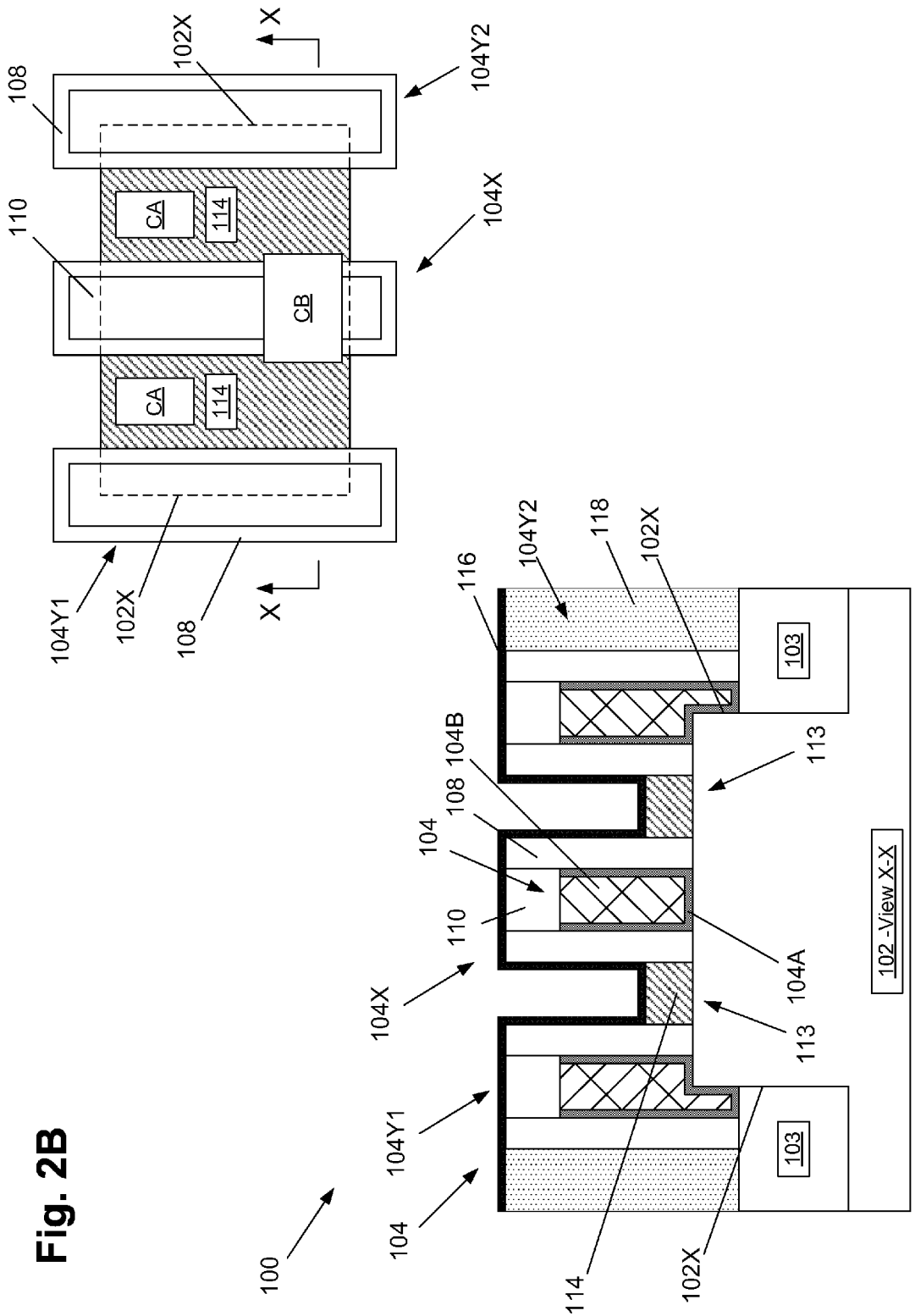
FIGS. 2A-2T depict various novel methods disclosed herein for forming a gate contact structure for a semiconductor device and the resulting device structures.
Figure 2C:
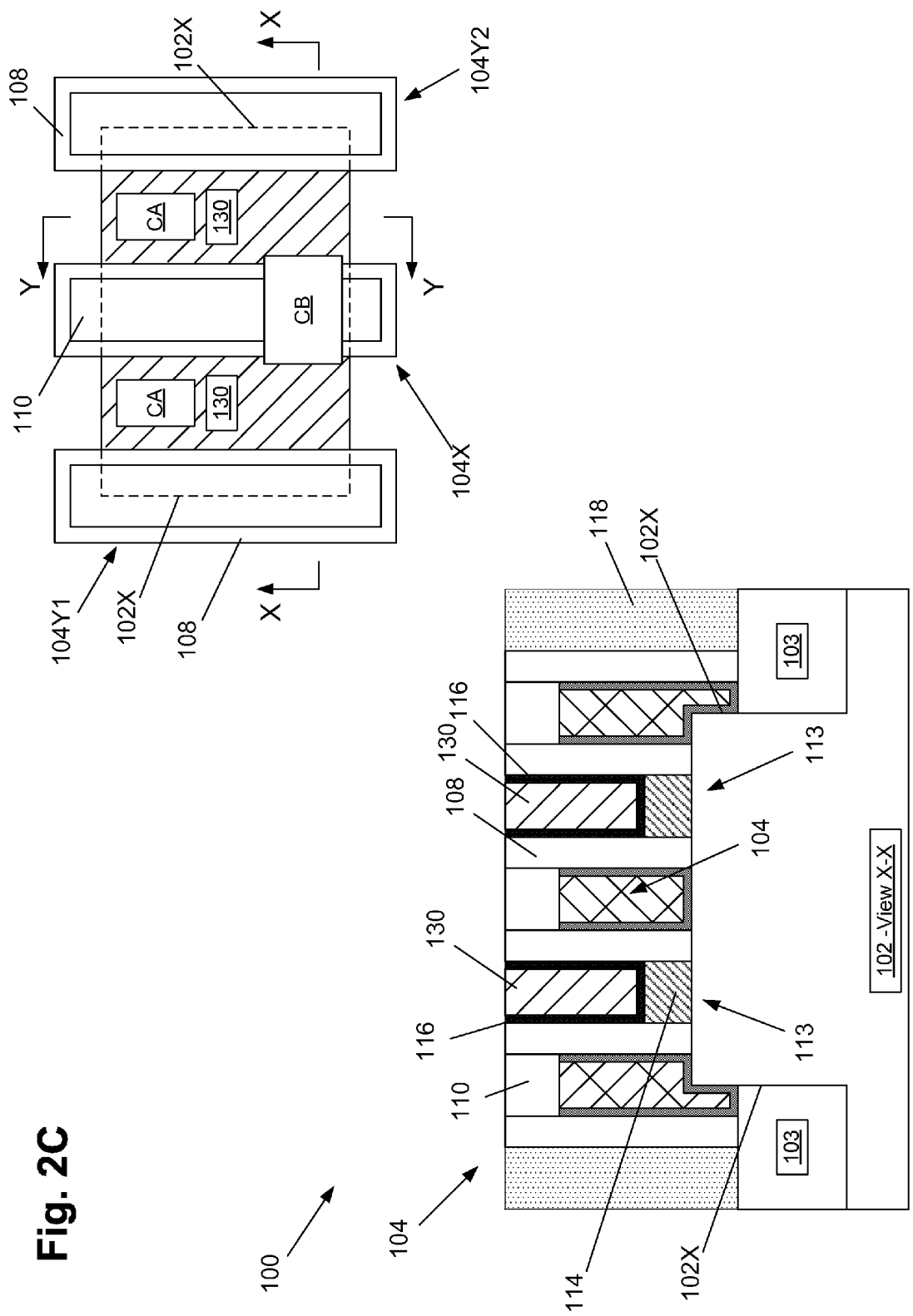
Figure 2E:
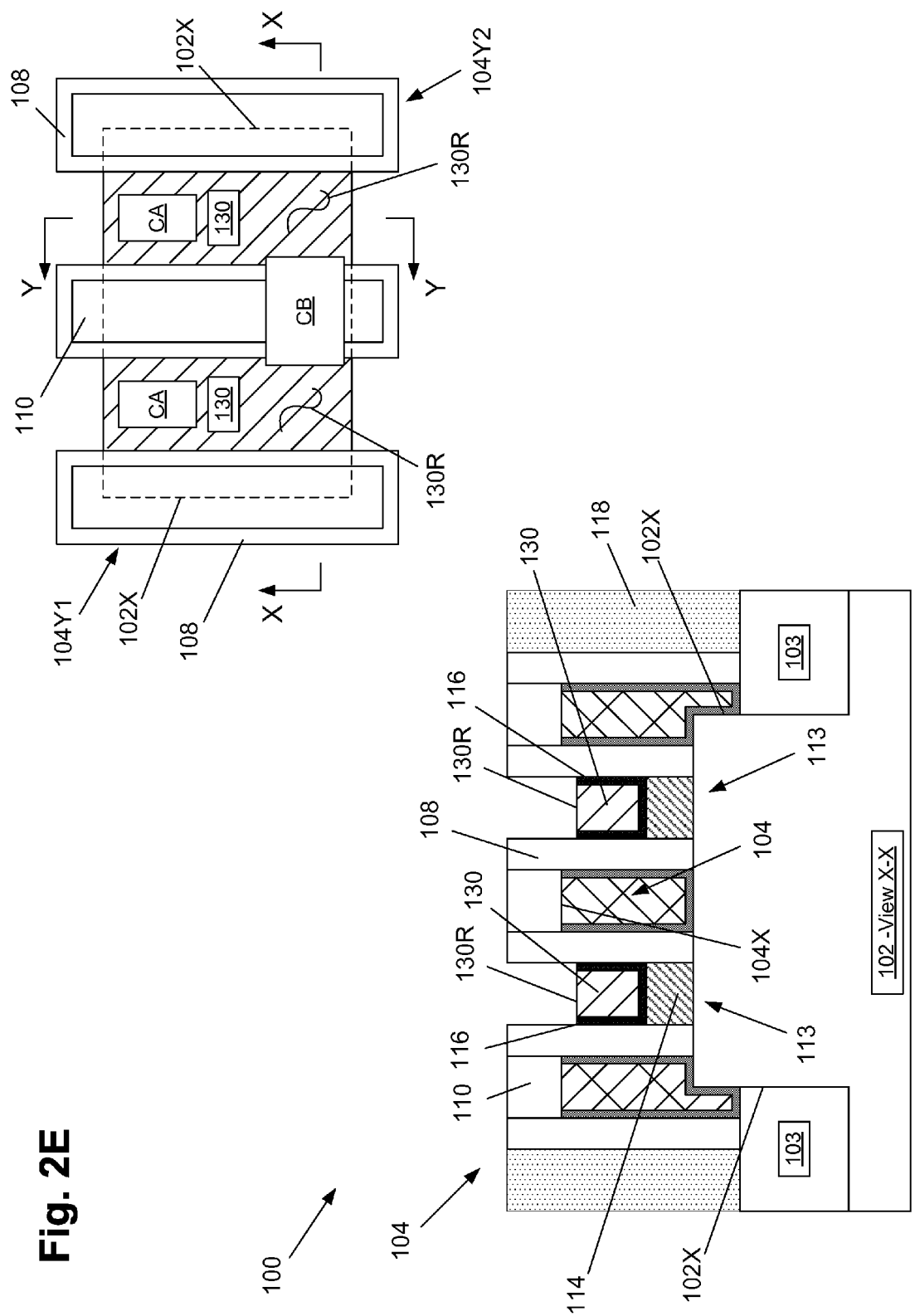
Figure 2F:
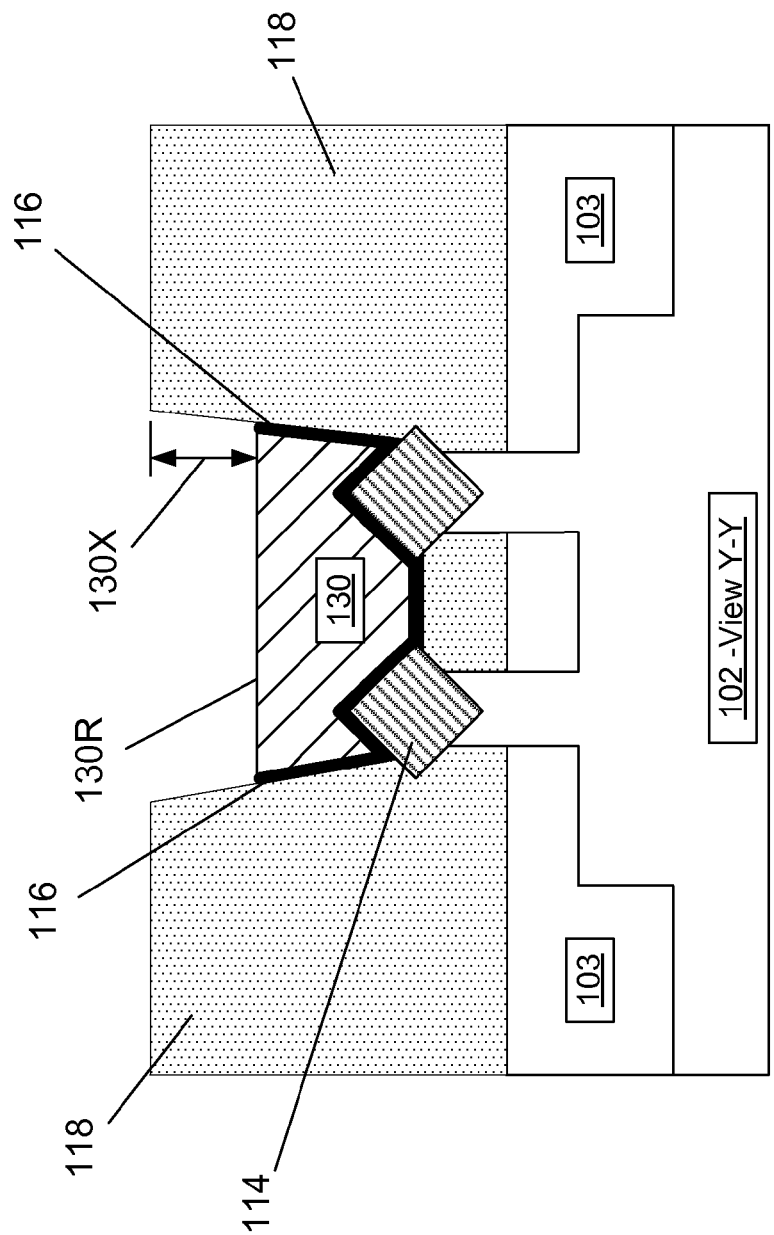
Figure 2G:
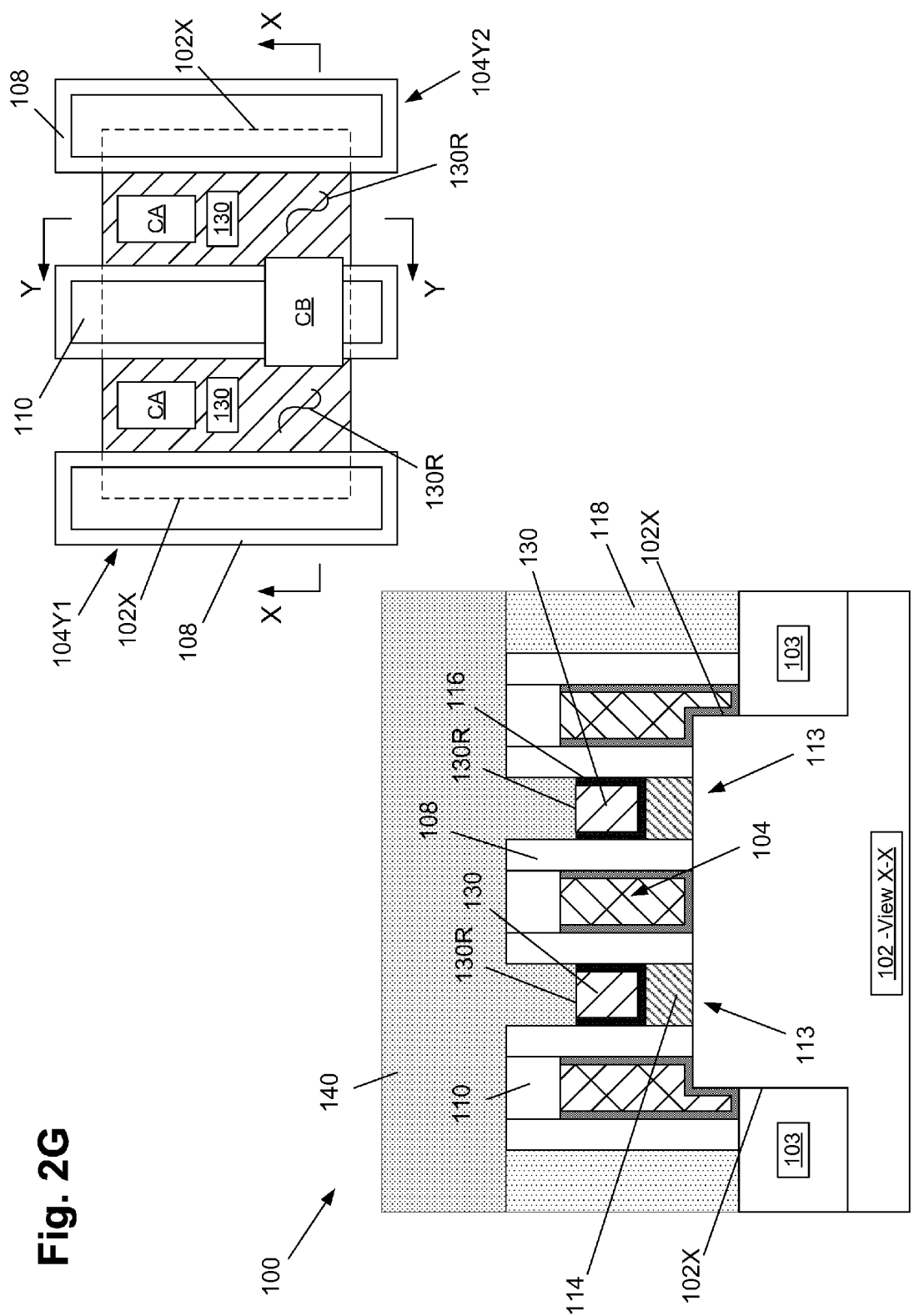
Figure 2H:
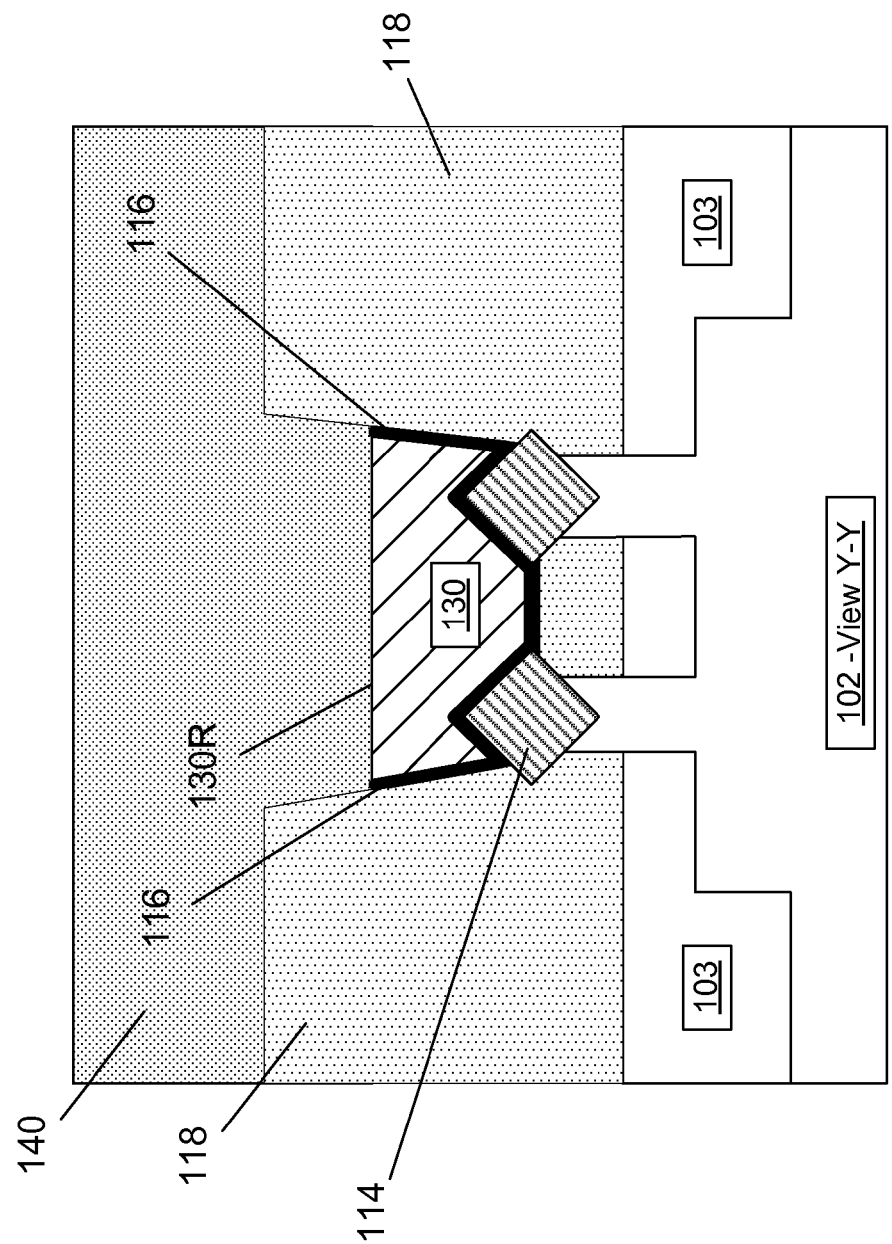
Figure 2I:
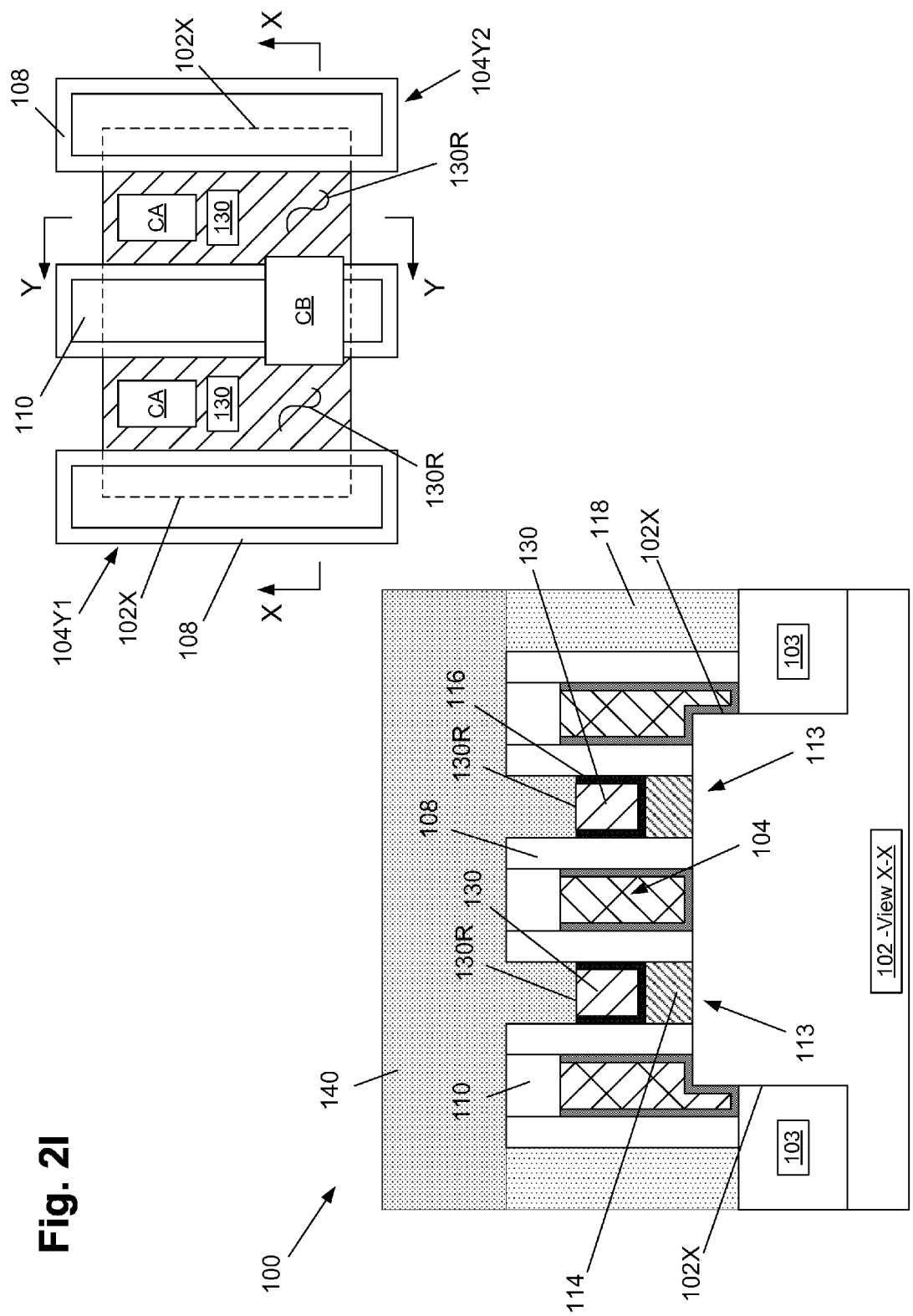
Figure 2J:
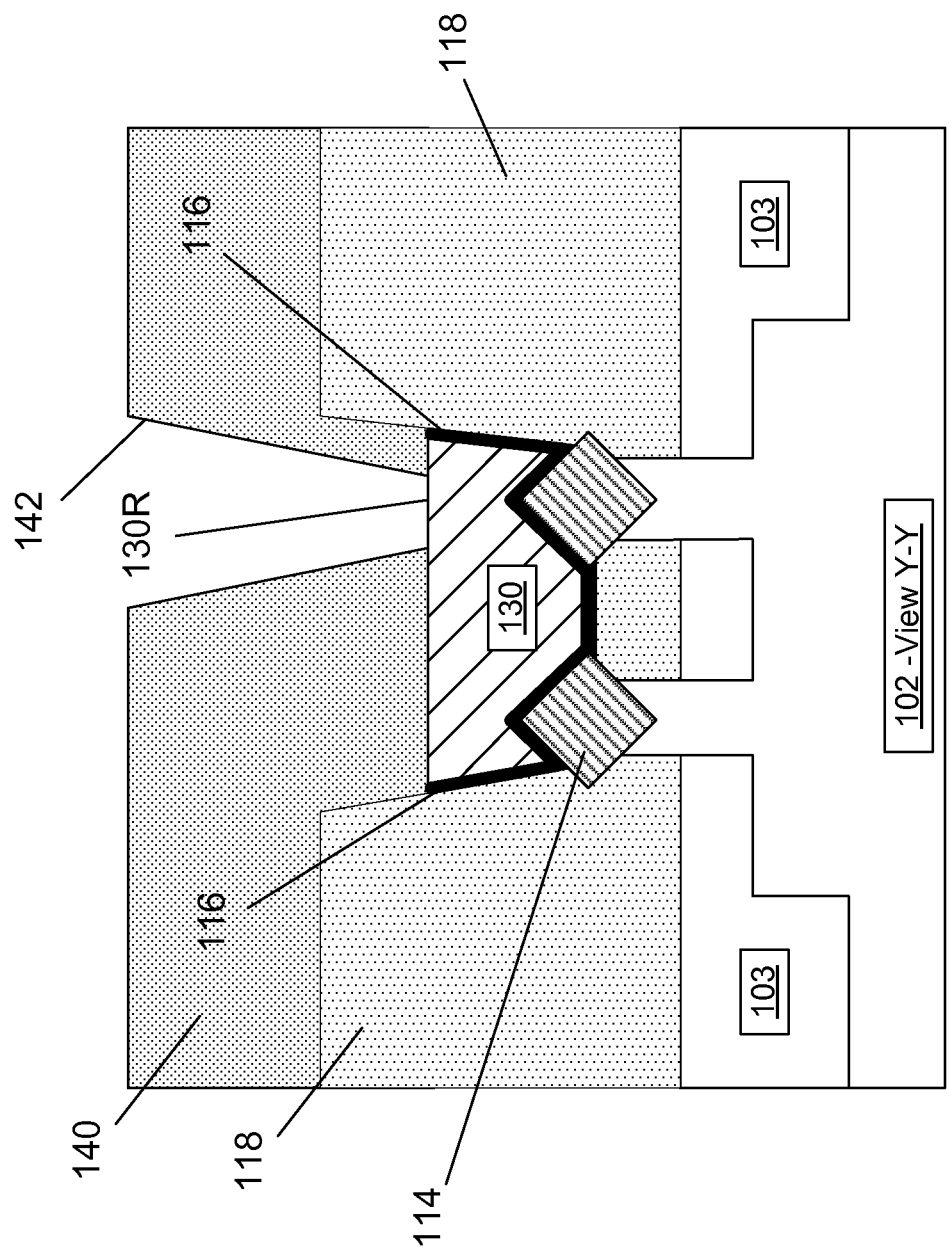
Figure 2L:
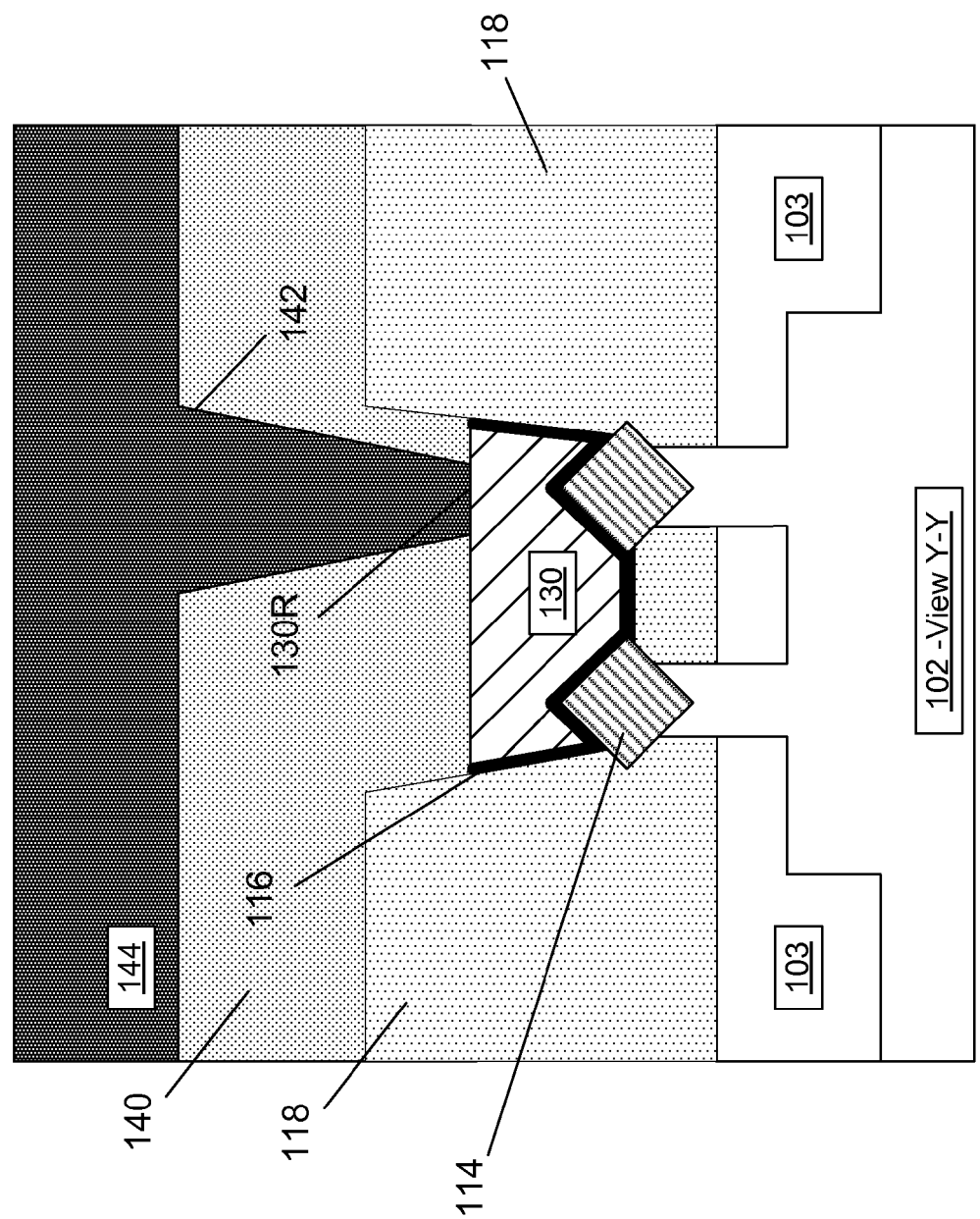
Figure 2M:
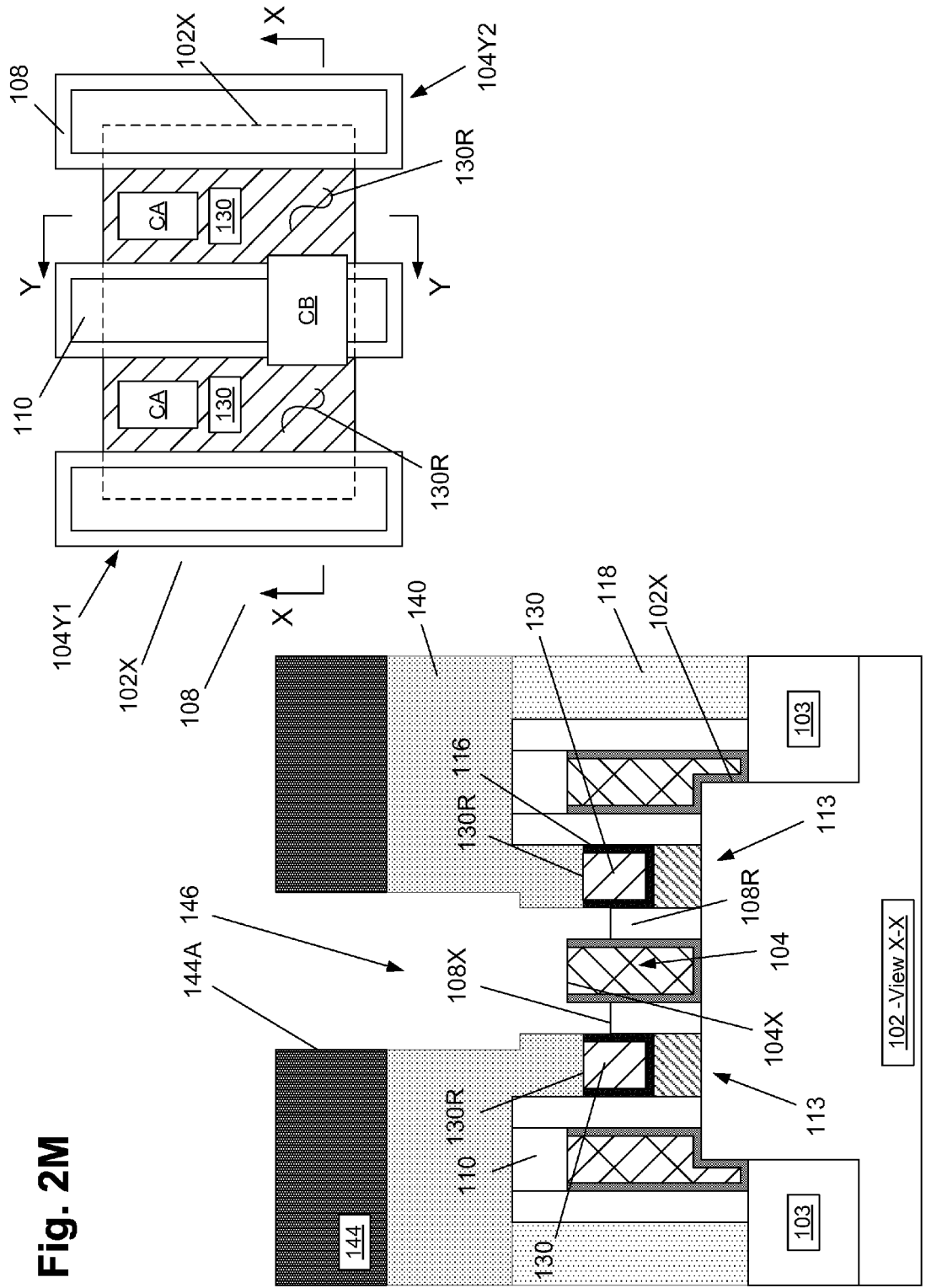
Figure 2N:
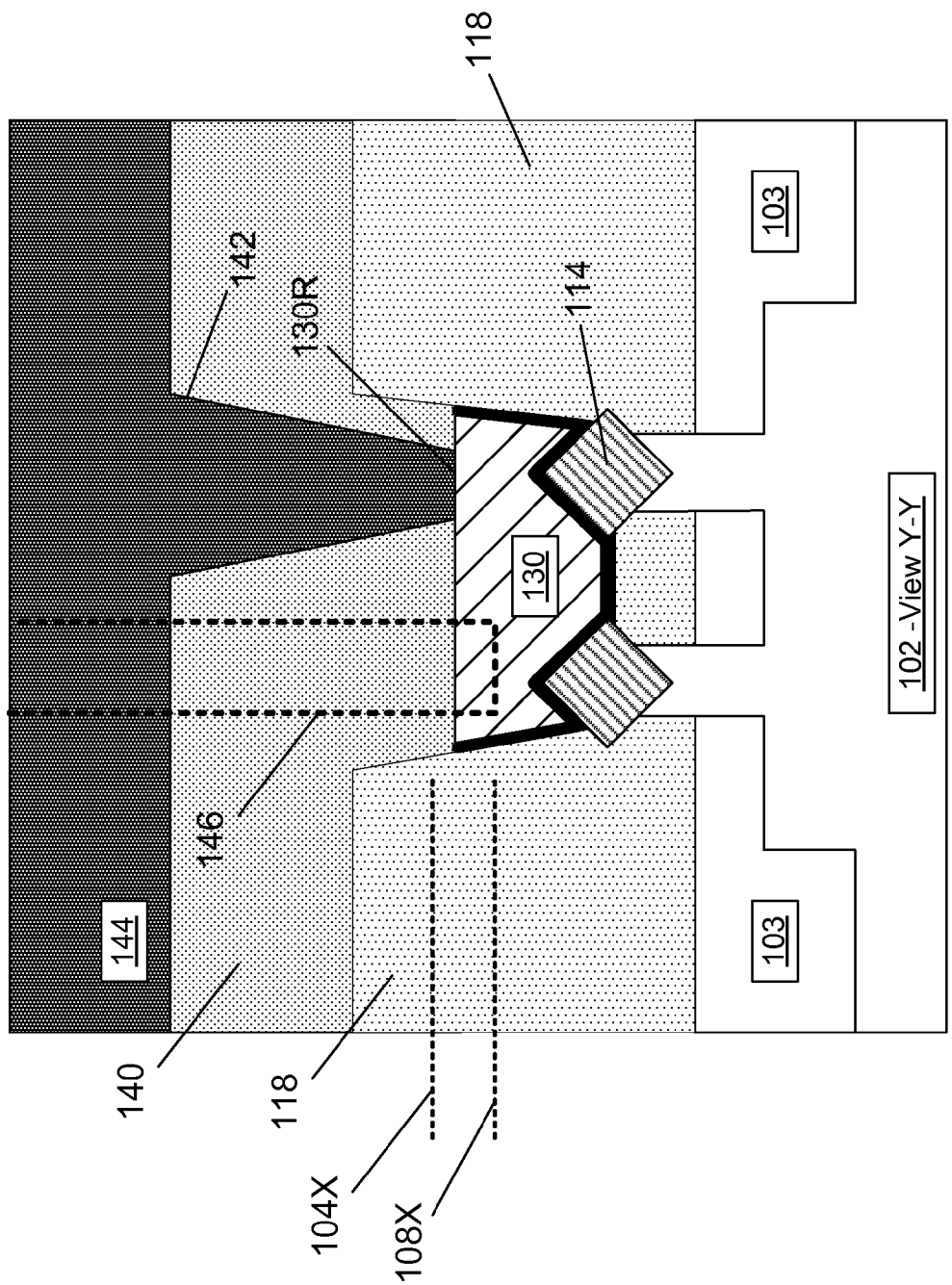
Figure 2O:
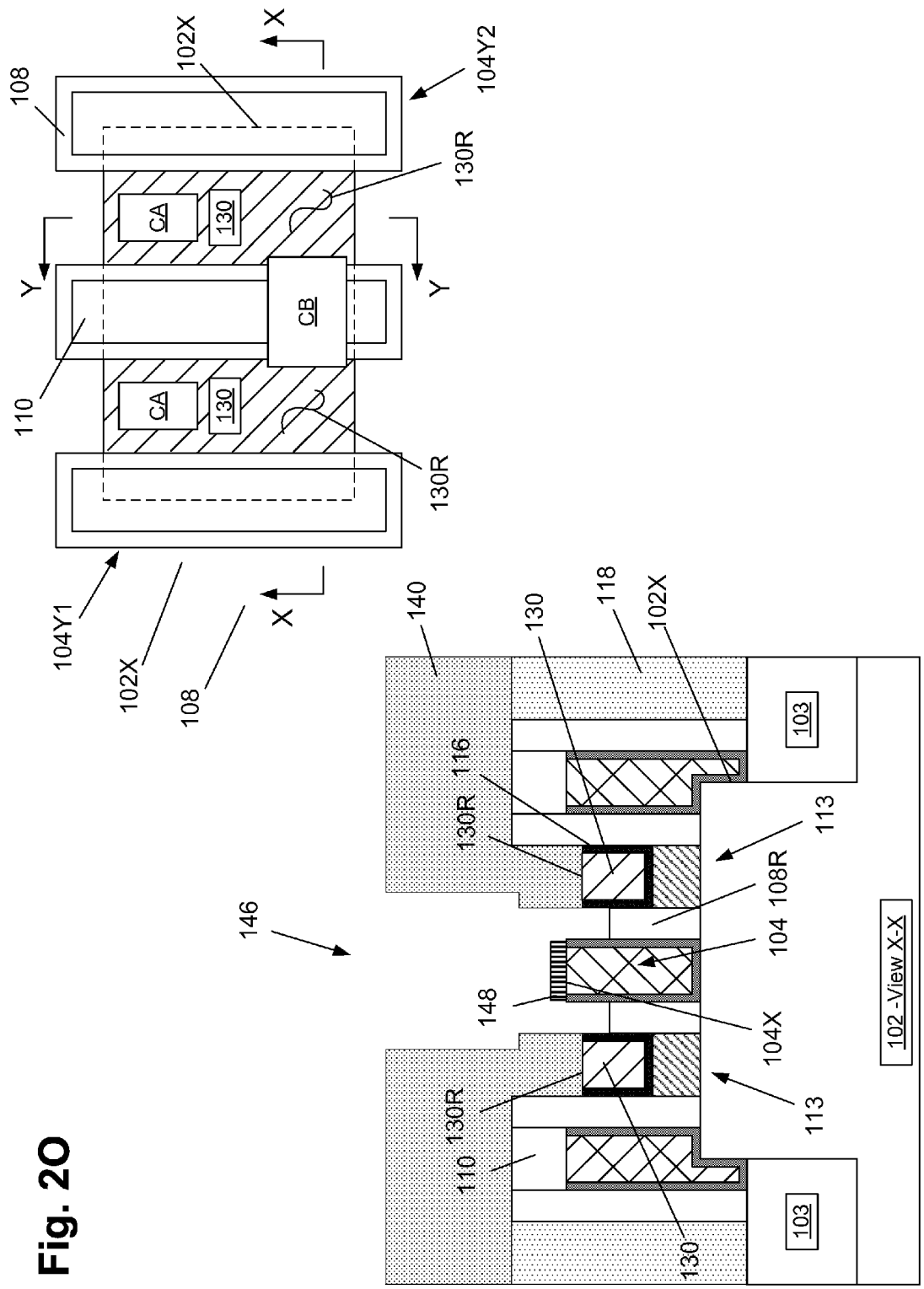
Figure 2P:
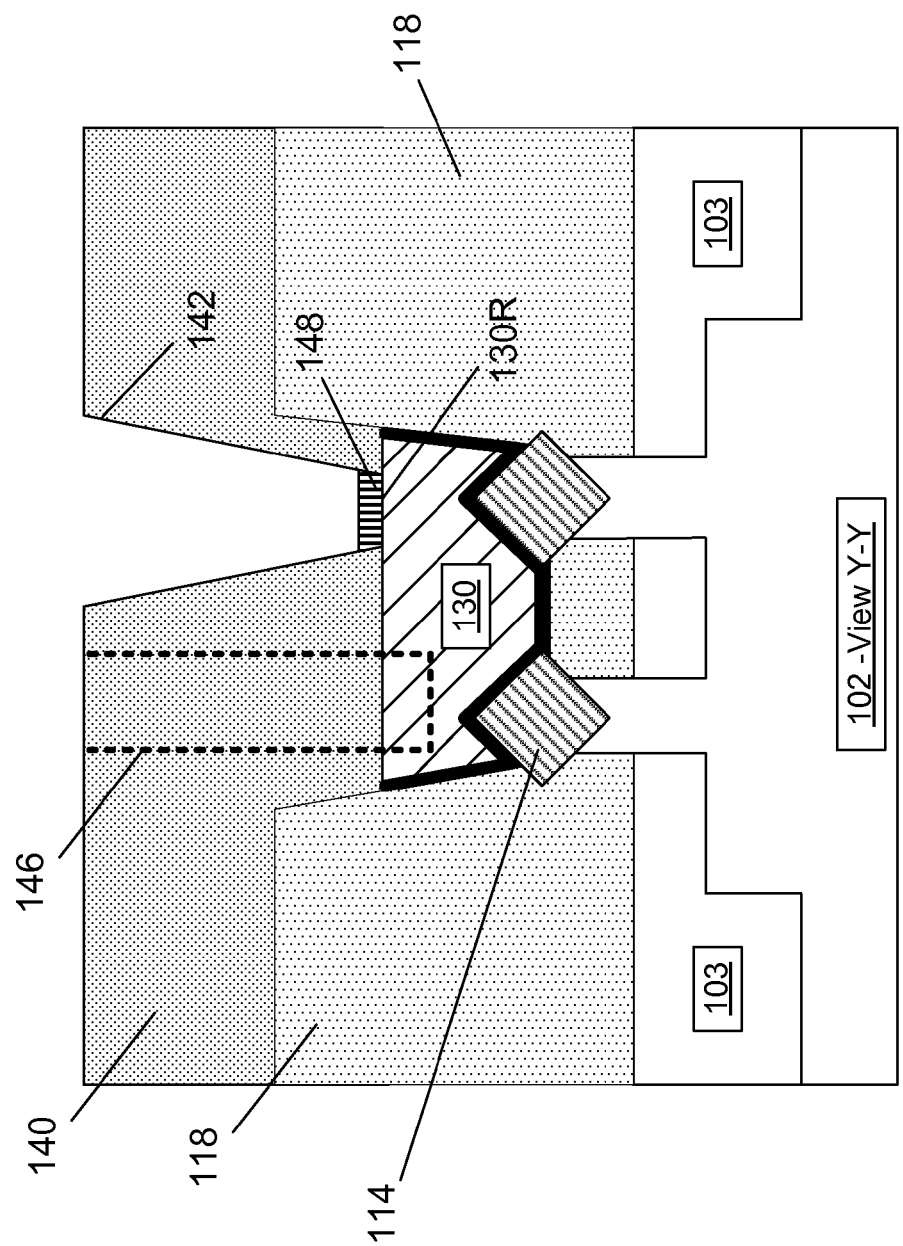
Figure 2Q:
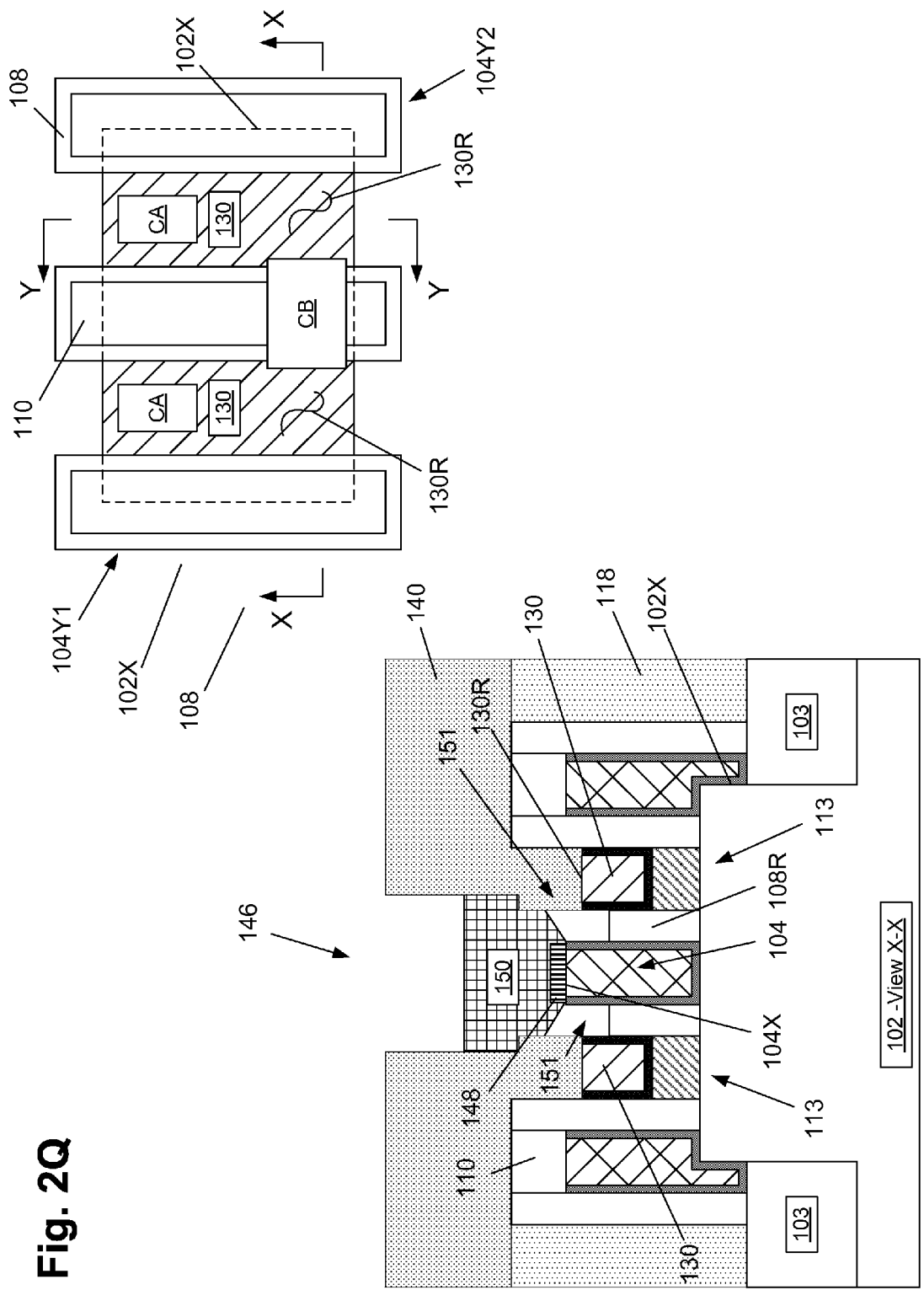
Figure 2R:
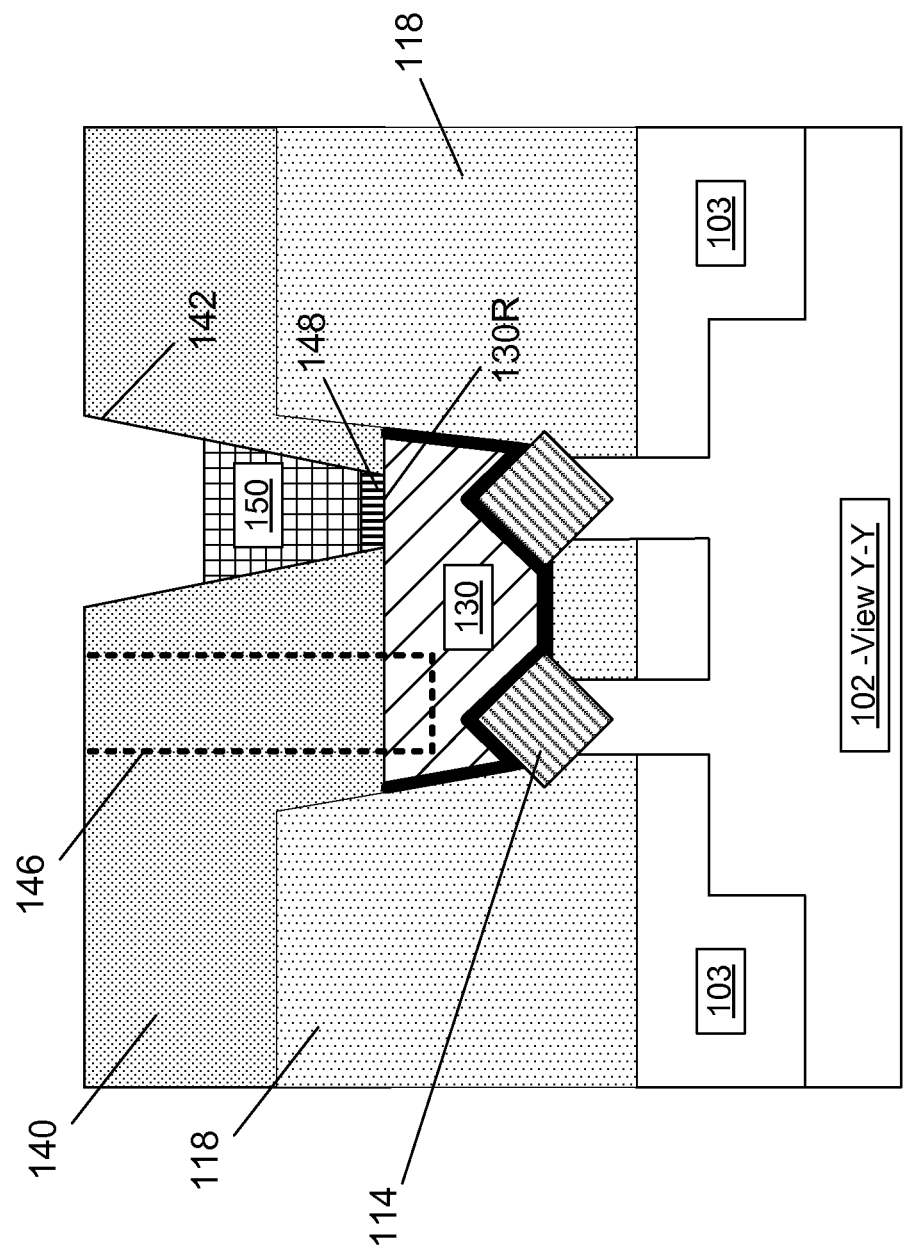
Figure 2T:
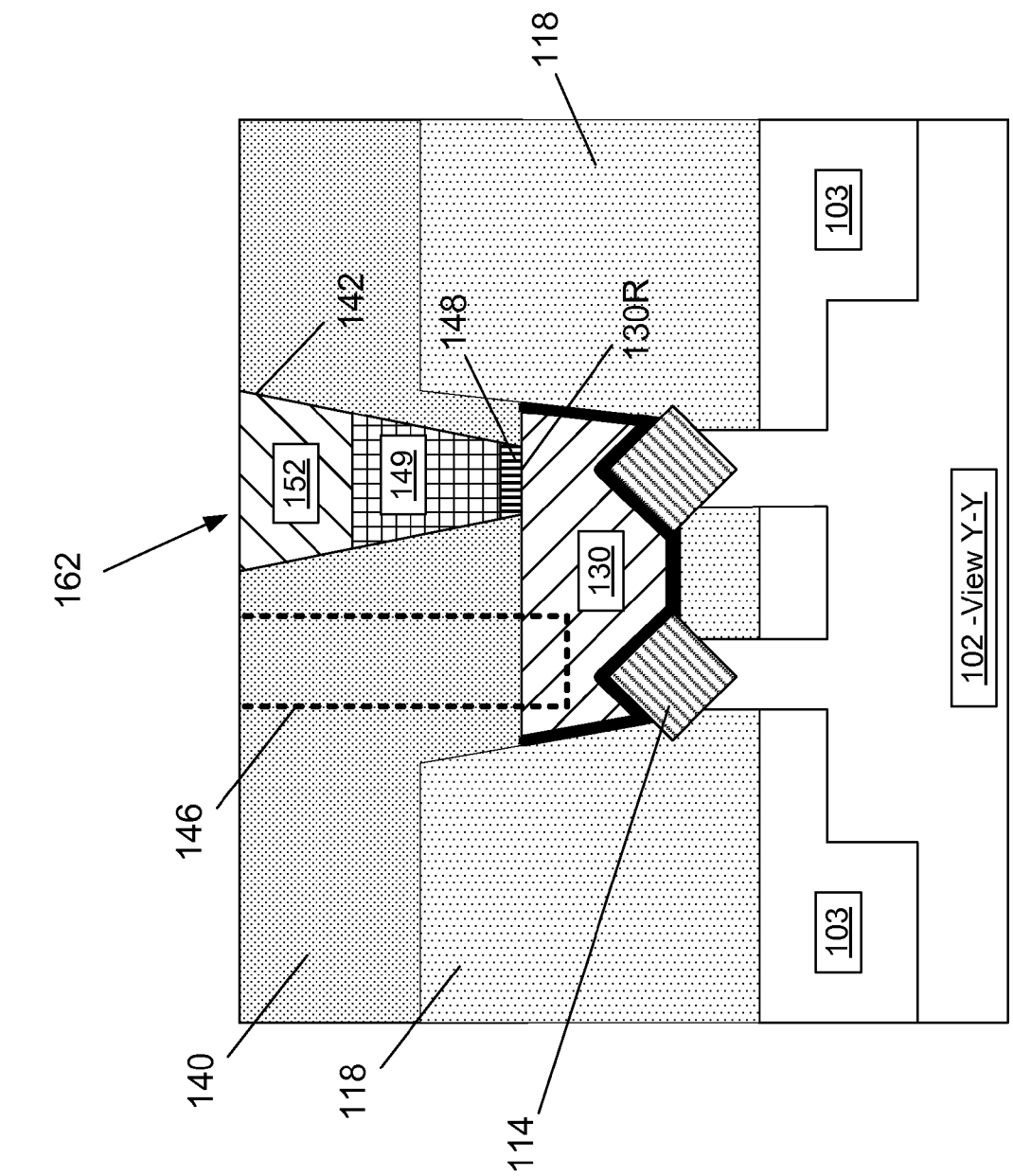

FIGS. 2A-2T depict various novel methods disclosed herein for forming a gate contact structure for a semiconductor device and the resulting device structures. Each of the figures contains a simplistic plan view showing where various cross-sectional views are taken in the drawings. The plan view also depicts where illustrative source/drain contacts ("CA") and a gate contact ("CB") will eventually be formed for the product 100. As indicated in FIG. 2A, the view X-X is a cross-sectional view taken through the device (in a direction corresponding to the gate length direction of the device) at a location where the gate contact ("CB") will eventually be formed. It should also be noted that, although each figure contains a plan view of the device, not all aspects of the processing shown in the cross-sectional views will be depicted in the plan view so as to not overly complicate the drawings.

With continuing reference to FIG. 2A, the illustrative product 100 will be formed in and above a semiconductor substrate 102. The product 100 may comprise either NMOS transistors, PMOS transistors or both types of transistors. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of semiconductor materials other than silicon. Thus, the terms "substrate" or "semiconductor substrate" should be understood to cover all semiconducting materials and all forms of such materials.

In the example depicted herein, the novel methods and devices will be described in the context of using a replacement gate manufacturing technique to form the gate structure for the product 100. Accordingly, FIG. 2A depicts the product 100 at a point in fabrication wherein several process operations have been performed to form a plurality of illustrative replacement gate structures 104 using traditional replacement gate manufacturing techniques. First, an isolation region 103 was formed in the substrate 102 so as to define an active region (102X) where a transistor device will be formed. Next, a plurality of illustrative replacement gate structures 104 were formed above the substrate 102. The gate structure 104X is the active gate structure for the transistor device, while the gate structures 104Y1 and 104Y2 are non-functional "dummy" gate structures as it relates to the operation of the transistor device.

The replacement gate structures 104 depicted herein are intended to be representative in nature of any type of gate structure that may be employed in manufacturing integrated circuit products using so-called gate-last (replacement gate) manufacturing techniques. A typical replacement gate process that results in the structure depicted in FIG. 2A may use the following process flow: formation of a sacrificial gate structure (not shown) that typically includes a sacrificial gate insulation layer, such as silicon dioxide, and a dummy or sacrificial gate electrode, such as polysilicon or amorphous silicon; formation of a sidewall spacer 108 and a sacrificial gate cap layer (both of which are typically comprised of silicon nitride); formation of an epi semiconductor material 114 in the source/drain regions 113 of the transistor devices (the epi semiconductor material 114 need not be formed in all applications); removal of the sacrificial gate cap layer and the sacrificial gate structure to define a replacement gate cavity between the spacers 108; formation of the replacement gate structure 104 in the replacement gate cavity; performing one or more recess etching processes to recess the replacement gate materials within the gate cavities so as to thereby make room for the gate cap layer 110; and formation of the gate cap layer 110. The physical size of the replacement gate structures 104 and the gate pitch for the gate structures may vary depending upon the particular application. Also depicted in FIG. 2A is an illustrative layer of insulating material 118, e.g., silicon dioxide.

The replacement gate structures 104 may be comprised of a variety of different materials. In one illustrative embodiment, the replacement gate structures 104 may comprise a high-k (k value greater than 10) gate insulation layer 104A, such as hafnium oxide (or other high-k materials), and one or more conductive metal or metal alloy layers (e.g., titanium, titanium nitride), all of which was deposited across the substrate 102 and within the gate cavity by performing several conformal deposition processes. Thereafter, the gate cavity was filled with a bulk metal such as tungsten. At the end of all of these metal formation processes, the replacement gate cavity is overfilled with material. Then, one or more CMP processes were performed to remove excess materials positioned outside of the gate cavity. Next, the replacement gate materials were recessed as described above and the gate cap layer 110 was formed above the recessed replacement gate structures 104. These process operations result in the definition of the illustrative and simplistically depicted replacement gate structures 104 depicted in FIG. 2A.

FIG. 2B depicts the product after several process operations were performed. First, an etching process was performed through a patterned etch mask (not shown), such as a patterned layer of photoresist material, to remove portions of the layer of insulating material 118 and thereby expose the source/drain regions 113 of the device, i.e., to expose the epi semiconductor material regions 114 in the depicted example. Next, a liner layer 116 was formed on the product 100 by performing a conformal deposition process. The liner layer 116 may be comprised of a variety of materials, e.g., titanium, titanium nitride, tantalum nitride, tantalum, tungsten nitride and tungsten carbide etc., and it may be formed by performing a conformal ALD or CVD process. The thickness of the liner layer 116 may vary depending upon the particular application, e.g., 1-4 nm.

FIGS. 2C (view X-X) and 2D (view Y-Y) depict the product 100 after simplistically depicted conductive source/drain structures 130 were formed so as to establish contact to the raised epi source/drain regions 114. The view Y-Y is a cross-sectional view taken through the source/drain regions 113 of the device in a direction that is parallel to the gate width direction of the device. The conductive source/drain structures 130 (irrespective of their precise configuration and the manner in which they are made) provide an electrical path between the raised epi source/drain regions 114 (or the source/drain region 113 if the epi material 114 is not formed) and the CA contact structures that are to be subsequently formed for the product. The configuration and structure of the conductive source/drain structures 130 may vary depending upon the particular application. In one example, the conductive source/drain structures 130 are line-type structures that extend into and out of the drawing page in FIG. 2C view X-X that extend for substantially the entire length of the active region (in a direction that corresponds to the gate width direction of the device) as shown in the plan view in FIG. 2C (wherein the liner layer 116 has been omitted). In some cases, conductive source/drain structures 130 comprise a trench metal silicide material (not separately shown) that is formed on and in contact with the raised epi source/drain regions 114, and a metal material, such as tungsten (not separately shown), that is formed on and in contact with the trench metal silicide material. After the formation of the materials that make up the conductive source/drain structures 130, a chemical mechanical polishing (CMP) process is performed to remove excess materials above the upper surface of the gate cap layers 110.

FIGS. 2E (view X-X) and 2F (view Y-Y) depict the product 100 after a timed, recess etching process was performed to recess the conductive source/drain structures 130 such that the recessed conductive source/drain structures 130 have a recessed upper surface 130R. The amount or depth 130X (see FIG. 2F) of such recessing may vary depending upon the particular application. In one particular embodiment, the recess etching process is performed until such time as the recessed upper surface 130R is at a level that is approximately equal to or slightly below (e.g., 0-5 nm) a level of the upper surface 104X of the replacement gate structure 104.

FIGS. 2G (view X-X) and 2H (view Y-Y) depict the product 100 after an illustrative layer of insulating material 140, e.g., silicon dioxide, was blanket deposited above the product 100. The layer of insulating material 140 may be the same material as that of the layer of material 118. A different shading is provided for the layer of insulating material 140 simply to show it was formed at a later point in the illustrative process flow depicted herein than was the layer of insulating material 118.

The next series of operations involves forming the CA and CB contact structures for the product 100. In the illustrative process flow depicted herein, the openings for the CA contacts (the source/drain contacts) will be formed prior to the opening for the CB contact (the gate contact). However, after a complete reading of the present application, those skilled in the art will appreciate that the process flow could be reversed, i.e., the opening for the CB contact could be formed prior to forming the openings for the CA contacts. Accordingly, FIGS. 2I (view X-X) and 2J (view Y-Y) depict the product 100 after a patterned masking layer (not shown) was formed above the layer of insulating material 140 and after an etching process was performed through the patterned masking layer to define a plurality of CA contact openings 142 (see FIG. 2J) in the layer of insulating material 140 that expose the recessed upper surface 130R of the recessed conductive source/drain structures 130. The masking layer covers the replacement gate structures during the CA contact opening etch process. Thereafter, the masking layer was removed. The overall size and shape of the CA contact openings 142 may vary depending upon the particular application.

FIGS. 2K (view X-X) and 2L (view Y-Y) depict the product 100 after a masking layer 144, e.g., OPL, was formed above the product 100. The masking layer 144 covers the previously formed CA contact openings 142, as shown in FIG. 2L. The masking layer 144 has an opening 144A (see FIG. 2K) that corresponds to a location for a gate contact (CB) opening 146 that will be formed in the layer of insulating material 140.

FIGS. 2M (view X-X) and 2N (view Y-Y) depict the product 100 after one or more etching processes were performed through the patterned masking layer 144 to define the gate contact (CB) opening 146 in the layer of insulating material 140, to remove the gate cap layer 110 and to recess portions of the sidewall spacer 108 so as to thereby expose the gate structure 104. This etching process results in recessed sidewall spacers 108R having a recessed upper surface 108X. The spacers 108 are recessed to insure that all insulating material, such as the silicon nitride gate cap layer 110, is completely removed from the upper surface 104X of the gate structure 104 so that good electrical contact may be made to the gate structure 104. Note that, the recessed conductive source/drain structures 130 are protected by the silicon dioxide material layer 140 when the silicon nitride gate cap layer 110 is removed and spacers 108 are recessed. FIG. 2N depicts the level of the upper surface 104X of the gate structure 104 and the upper surface 108X of the spacers 108 within the gate contact opening 146, which are all depicted in dashed lines due to the fact that the gate contact opening 146 is not in the plane of the cross-sectional view Y-Y shown in Figure N.

FIGS. 2O (view X-X) and 2P (view Y-Y) depict the product 100 after a layer of a noble metal 148, such as palladium, was selectively formed on the exposed upper surface 104X of the gate structure 104 by performing a wet, electroless plating process. In one illustrative embodiment, the noble metal layer 148 may have a thickness of about 1-2 nm. In one particular example, where the exposed upper surface 104X of the gate structure 104 comprises tungsten, a tungsten pre-clean process may be performed, followed by the formation of a layer of palladium 148. In some embodiments, the noble metal layer 148 may be omitted.

FIGS. 2Q (view X-X) and 2R (view Y-Y) depict the product 100 after a metal material 150, such as cobalt, etc., was selectively grown on the noble metal layer 148 by performing a wet, electroless plating process. The growth of the metal material 150 is primarily vertical in nature due to surface energy. The metal material 150 is formed until such time as the metal material 150 pinches-off the CB contact opening 146, i.e., contacts all of the sidewalls of the contact opening 146. The pinching off of the CB contact opening 146 results in the formation of a plurality of air-gaps or spaces 151 below the bottom of the metal material 150 and above the upper surface 108X of the recessed spacers 108R adjacent the gate structure 104. That is, the air spaces 151 are positioned adjacent the gate structure 104 above the recessed spacers 108R and a portion of the conductive structures 130 as well as below the bottom surface of the metal material 150. As used herein and in the attached claims, when it is stated that the air gaps 151 are positioned "between" various structures, such terminology should be understood to encompass the configuration of the air spaces 151 shown in FIG. 2Q positioned relative to the position or location of the recessed spacers 108R and the conductive structures 130. As shown in FIG. 2R, such spaces 151 will typically not be present below the metal material 150 in the CA contact openings 142 because the noble metal layer 148 is positioned across substantially the entire bottom of the CA contact openings 142. The formation of the spaces 151 effectively prevents contact, i.e., shorting, between the gate contact structure formed in the gate contact (CB) opening 146 and the recessed conductive source/drain structures.

FIGS. 2S (view X-X) and 2T (view Y-Y) depict the product 100 after the remaining portions of the CB contact opening 146 and the CA contact openings 142 are filled with one or more conductive materials 152, e.g., tungsten or cobalt with a titanium or titanium nitride liner, so as to complete the formation of the CB contact 160 and the plurality of CA contacts 162. The contact structures 160, 162 may be of any desired cross-sectional configuration when viewed from above, e.g., square, rectangular, round, etc. The conductive materials 152 are intended to be schematic and representative in nature, as they may be formed using any of a variety of different conductive materials and by performing traditional manufacturing operations. In one illustrative example, the conductive materials 152 may be formed by depositing a liner, e.g., Ti, TiN, followed by overfilling the contact openings with a conductive material, such as tungsten or cobalt. Thereafter, a CMP process may be performed to planarize the upper surface of the layer of insulating material 140, which results in the removal of excess portions of the liner and the tungsten (or cobalt) positioned above the layer of insulating material 140 outside of the contact openings 146, 142.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a gate contact for a gate structure of a transistor device formed above an active region defined in a semiconductor substrate, said transistor device comprising a source/drain region, a gate structure including a gate insulation layer and a conductive gate material and having a gate cap layer positioned above an upper surface of said conductive gate material and a sidewall spacer positioned adjacent first and second opposing sides of said gate structure, said gate insulation layer being disposed between said conductive gate material and said sidewall spacer on sidewalls of said conductive gate material, the method comprising:

forming an initial conductive source/drain structure that is conductively coupled to said source/drain region of said transistor device;

performing a recess etching process on said initial conductive source/drain structure to thereby define a recessed conductive source/drain structure having a recessed upper surface that is positioned at a level that is approximately even with or below a level of said upper surface of said conductive gate material;

forming a layer of insulating material above said gate structure, said gate cap layer, said sidewall spacer, and said upper surface of said recessed conductive source/drain structure;

etching said layer of insulating material to form a gate contact opening in said layer of insulating material, said gate contact opening having sidewalls;

performing at least one etching process through said gate contact opening to remove said gate cap layer and at least a portion of said sidewall spacer on each of said first and second opposing sides of said gate structure to expose at least a portion of said gate structure, including said upper surface of said conductive gate material and sidewall surfaces of said gate insulation layer, and to expose a sidewall portion of said recessed conductive source/drain structure;

performing at least one first plating operation through said gate contact opening to selectively grow a metal material on said upper surface of said conductive gate material such that said grown metal material contacts said sidewalls of said gate contact opening disposed above said upper surface of said conductive gate material and an air space is defined by a bottom surface of said grown metal material and said exposed sidewall portion of said recessed conductive source/drain structure; and forming one or more conductive materials in said gate contact opening above said grown metal material.

2. The method of claim 1, wherein forming said gate contact opening in said layer of insulating material comprises forming said gate contact opening such that the entire gate contact opening is positioned vertically above said active region.

3. The method of claim 1, wherein performing said at least one etching process through said gate contact opening comprises performing said at least one etching process through said gate contact opening so as to recess an entire lateral width of said sidewall spacer.

4. The method of claim 1, wherein, prior to performing said at least one first plating operation, the method further comprises performing a wet, electroless plating process to selectively form a layer comprising a noble metal on said exposed upper surface of said conductive gate material and wherein performing said at least one first process operation comprises performing said at least one first plating operation so as to selectively grow said grown metal material on and in contact with said layer comprising said noble metal.

5. The method of claim 4, wherein said layer comprising said noble metal comprises palladium.

6. The method of claim 1, wherein performing said at least one first plating operation comprises performing a wet, electroless plating process to selectively grow said metal material.

7. The method of claim 6, wherein said grown metal material comprises cobalt.

8. The method of claim 1, wherein said transistor device is one of a FinFET transistor device or a planar transistor device.

9. The method of claim 1, wherein said gate structure comprises tungsten.

10. The method of claim 1, wherein forming one or more conductive materials in said gate contact opening comprises forming one of tungsten or copper in said gate contact opening.

11. A method of forming a gate contact for a gate structure of a transistor device including a source/drain region formed above an active region defined in a semiconductor substrate, said gate structure including a gate insulation layer and a conductive gate material and having a gate cap layer positioned above an upper surface of said conductive gate material and a sidewall spacer positioned adjacent first and second opposing sides of said gate structure, said gate insulation layer being disposed between said conductive gate material and said sidewall spacer on sidewalls of said conductive gate material, the method comprising:

forming an initial conductive source/drain structure that is conductively coupled to said source/drain region of said transistor device;

performing a recess etching process on said initial conductive source/drain structure to thereby define a recessed conductive source/drain structure having a recessed upper surface that is positioned at a level that is approximately even with or below a level of said upper surface of said conductive gate material;

forming a layer of insulating material above said gate structure, said gate cap layer, said upper surface of said recessed conductive source/drain structure, and said sidewall spacer;

etching said layer of insulating material to form a gate contact opening in said layer of insulating material, said gate contact opening having sidewalls;

performing at least one etching process through said gate contact opening to remove said gate cap layer and to recess any exposed portions of said sidewall spacer on each of said first and second opposing sides of said gate structure so as to expose at least said upper surface of said conductive gate material, sidewall surfaces of said gate insulation layer, and a sidewall portion of said recessed conductive source/drain structure, wherein said recessed portion of said sidewall spacer has a recessed upper surface that is positioned at a level that is below a level of said exposed upper surface of said conductive gate material;

performing a first plating operation through said gate contact opening to selectively form a layer comprising a noble metal on said exposed upper surface of said conductive gate material;

performing a second plating operation through said gate contact opening to selectively grow a metal material on said layer comprising said noble metal such that said grown metal material contacts said sidewalls of said gate contact opening disposed above said upper surface of said conductive gate material and an air space is defined by a bottom surface of said grown metal material, said exposed sidewall portion of said recessed conductive source/drain structure, and said recessed upper surface of said recessed sidewall spacer; and forming one or more conductive materials in said gate contact opening above said grown metal material.

12. The method of claim 11, wherein forming said gate contact opening in said layer of insulating material comprises forming said gate contact opening such that the entire gate contact opening is positioned vertically above said active region.

13. The method of claim 11, wherein performing said at least one etching process through said gate contact opening comprises performing said at least one etching process through said gate contact opening so as to recess an entire lateral width of said sidewall spacer.

14. The method of claim 11, wherein performing said first plating operation comprises performing a wet, electroless plating process to selectively form said layer comprising said noble metal.

15. The method of claim 14, wherein said layer comprising said noble metal comprises palladium.

16. The method of claim 11, wherein performing said second plating operation comprises performing a wet, electroless plating process to selectively grow said metal material on said layer comprising said noble metal.

17. The method of claim 16, wherein said grown metal material comprises cobalt.

18. The method of claim 11, wherein said gate structure is comprised of tungsten.

* * * * *